(12) United States Patent
Ryan et al.

(10) Patent No.: US 8,600,317 B2
(45) Date of Patent: Dec. 3, 2013

(54) LINEARIZATION SIGNAL PROCESSING WITH CONTEXT SWITCHING

(75) Inventors: Timothy Ryan, San Francisco, CA (US); Ravichandran Ramachandran, San Jose, CA (US)

(73) Assignee: Broadcom Corporation, Irvine, CA (US)

(*) Notice: Subject to any disclaimer, the term of this patent is extended or adjusted under 35 U.S.C. 154(b) by 97 days.

(21) Appl. No.: 13/421,354

(22) Filed: Mar. 15, 2012

(65) Prior Publication Data
US 2013/0244728 A1    Sep. 19, 2013

(51) Int. Cl.
    *H04B 1/40* (2006.01)
(52) U.S. Cl.
    USPC .............................. 455/84; 455/77
(58) Field of Classification Search
    USPC ............... 455/84, 73, 186.1, 230, 77
    See application file for complete search history.

(56) References Cited

U.S. PATENT DOCUMENTS

| 8,219,754 | B2* | 7/2012 | Ringe et al. | 711/118 |
| 2004/0242261 | A1* | 12/2004 | Fette | 455/550.1 |
| 2006/0258343 | A1* | 11/2006 | Schotten | 455/418 |
| 2007/0198265 | A1* | 8/2007 | Yao | 704/254 |
| 2012/0302270 | A1* | 11/2012 | Sathish | 455/500 |

* cited by examiner

*Primary Examiner* — Sonny Trinh
(74) *Attorney, Agent, or Firm* — Sterne, Kessler, Goldstein & Fox P.L.L.C.

(57) ABSTRACT

A system for linearization signal processing with context switching comprises a plurality of signal processing units, a storage unit, a feedback channel, and a correlator. The plurality of signal processing units is associated with corresponding input data signals. The storage unit is to store context states associated with input data signals and corresponding feedback signals. The feedback channel is to convey feedback signals from outputs associated with the plurality of signal processing units. The correlator is coupled to the feedback channel and generates respective correcting information to be used by respective signal processing units, wherein a respective correcting information is based upon a context state and a feedback state associated with an input data signal.

20 Claims, 19 Drawing Sheets

LINEARIZATION SIGNAL PROCESSING WITH CONTEXT SWITCHING

BACKGROUND

Related Art

Signal processing devices appear in a wide range of technical areas. In addition to quality signal capture, analysis, and computation, needs for efficiency in processing information at high volume, low speed, and minimum cost are among driving concerns. Conventional systems include specialized single-use devices with limited flexibility in terms of processing varying numbers of signals and accommodating varying requirements for processing at higher speeds. Thus, conventional systems separate implementations for accommodating varying volume and speed requirements. These conventional systems also include redundant and duplicative signal processing hardware, resulting in increased cost and size. Thus, more flexible, smaller, and simplified solutions in the field are required.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears.

Figure 1:
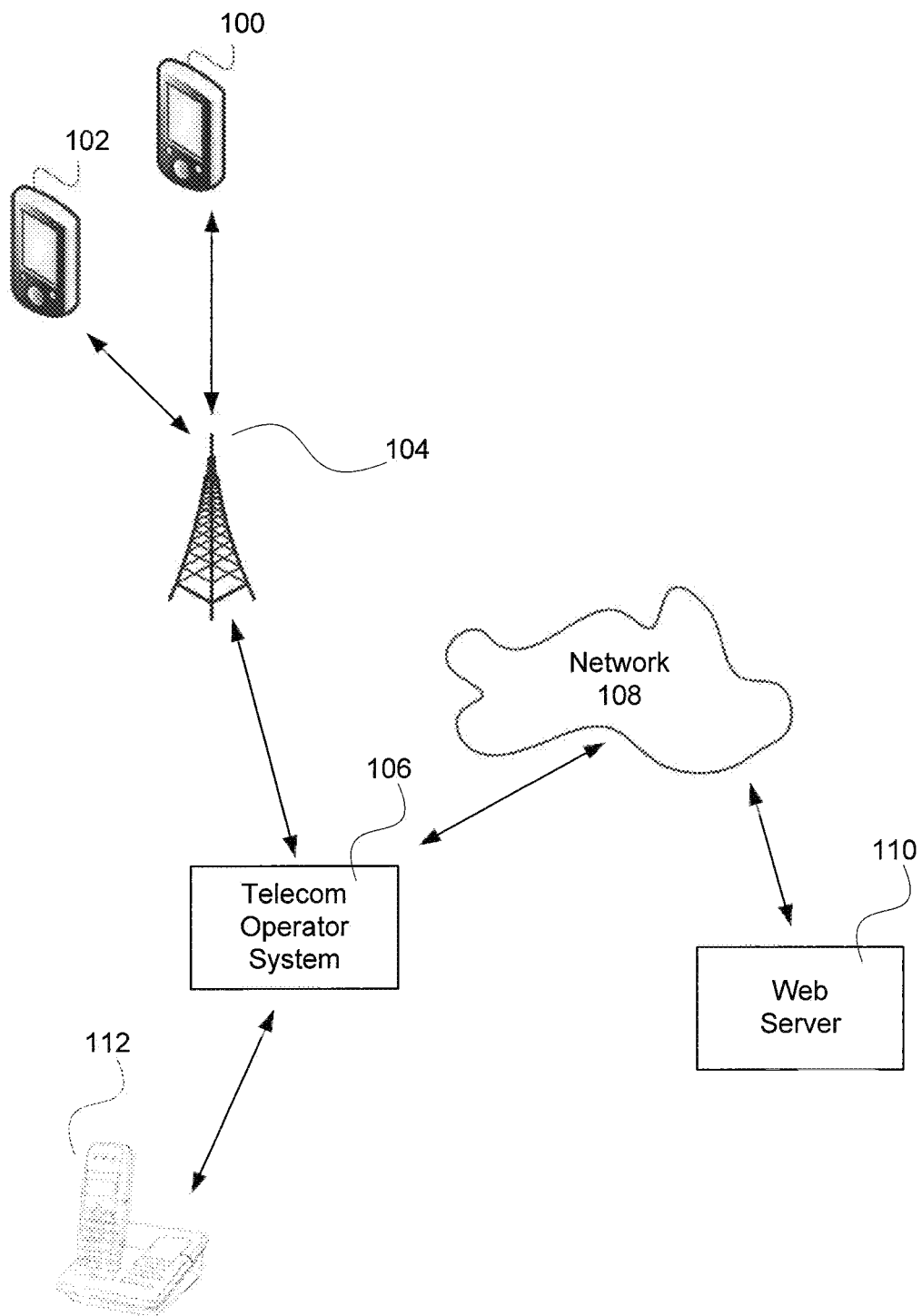
FIG. 1 is a diagram illustrating an embodiment of a communication network incorporating mobile devices.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the Detailed Description is not meant to limit the disclosure. Rather, the scope of the disclosure is defined only in accordance with the following claims and their equivalents.

Those skilled in the relevant art(s) would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those skilled in the relevant art(s) would further appreciate that the various illustrative logical blocks, modules, circuits, and algorithm steps described in connection with the embodiments disclosed herein implemented in hardware, firmware, software, or any combination thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments.

The various illustrative logical blocks, modules, and circuits described in connection with the embodiments disclosed herein may be implemented or performed as instructions stored on a machine-readable medium, which may be read and executed by with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. A machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

The steps of a method or algorithm described in connection with the embodiments disclosed herein may be embodied directly in hardware, in a software module executed by a processor, or in a combination of the two. A software module may reside in the machine-readable medium as described above or any other form of storage medium known in the relevant art(s). An exemplary nonvolatile storage medium is coupled to the processor such the processor can read information from, and write information to, the storage medium. In the alternative, the nonvolatile storage medium may be integral to the processor. The processor and the nonvolatile storage medium may reside in an ASIC.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

A system for linearization signal processing with context switching comprises a plurality of signal processing units, a storage unit, a feedback channel, and a correlator. The plurality of signal processing units is associated with corresponding input data signals. The storage unit is to store context states associated with input data signals and corresponding feedback signals. The feedback channel is to convey feedback signals from outputs associated with the plurality of signal processing units. The correlator is coupled to the feedback channel and generates respective correcting signals or correcting parameter sets to be used by respective signal processing units, wherein a respective correcting signal or correcting parameter set is based at least in part on a context state and a feedback state associated with an input data signal.

Linearization signal processing with context switching is disclosed. A method for processing a plurality of signals comprises 1) associating a plurality of input data signals with a corresponding plurality of signal processing units, wherein each input data signal of the plurality of input data signals has a corresponding feedback signal; 2) for each feedback signal: a) retrieve a context state associated with the feedback signal; b) receive a feedback signal; c) generate a respective correcting signal or correcting parameter set to be used by respective signal processing units based at least in part on the context state and the feedback signal.

In some embodiments, correcting information comprises a correcting signal or a correcting parameter set. In some embodiments, a system and method for signal processing provides flexible processing capabilities and simplified component design. The system is capable of processing one or more input data signals concurrently, and is capable of sharing an error correction system among a plurality of signal processing units used in processing the one or more input data signals. The system may include an additional storage for facilitating management of multiple signals concurrently. For example, an integrated circuit or chip comprises one or more signal processing units with the ability to process one or more signals for transmission and/or reception that is coupled to a separate integrated circuit or chip comprising a memory.

In some embodiments, for a base station for a mobile telecom network, a signal processing system is disclosed that includes an ability to process one or more signals concurrently. In some embodiments, the signal processing system is able to change the number of signals processed concurrently. In some embodiments, the processing of a plurality of signals includes providing a corrective feedback for each of the plurality of signals that corrects for nonlinear behavior of the system (e.g., correcting for nonlinear amplification of each signal, linearization of the system, etc.). The output signal from an amplifier is sampled by a correction system which determines an error (e.g., a correlator determines an error between a distorted output signal of an amplifier and a desired input data signal). This error determination is then used to reduce the error at the output of the amplifier by determining a correcting signal or correcting parameters for correcting the signal (e.g., for linear or nonlinear filters) that are used to pre-process the signal to reduce the error. The signal processing system shares the correcting system between each of the plurality of input data signals by correcting each of the signals for a period of time and then switching to a next signal.

FIG. 1 is a diagram illustrating an embodiment of a communication network incorporating mobile devices. In the example shown, a mobile phone base station 104 handles multiple two-way communications for cell phone users communicating from a mobile phone 100 to another mobile phone 102, or to a web server 110, a land line phone 112, or any other communications platform. Each type of mobile phone that communicates with the base station 104 has a particular communications protocol including different physical layer protocols as well as different logical layer protocols. A number of mobile devices may connect to and communicate with each base station 104, and may request one or more of many specific services of the mobile device 100 or 102 over the base station 104. Such services include, but are not limited to, voice, data (Internet or otherwise), text messaging, multimedia messaging, and location services, and are transmitted through a telecom operator system 106 to a network 108 such as the Internet. Such a wide variety of potential services and variations in the number of phones interfacing with the base station at any one time require a signal processing system that is flexible and robust enough to handle both high parallelism and high throughput.

Figure 2:
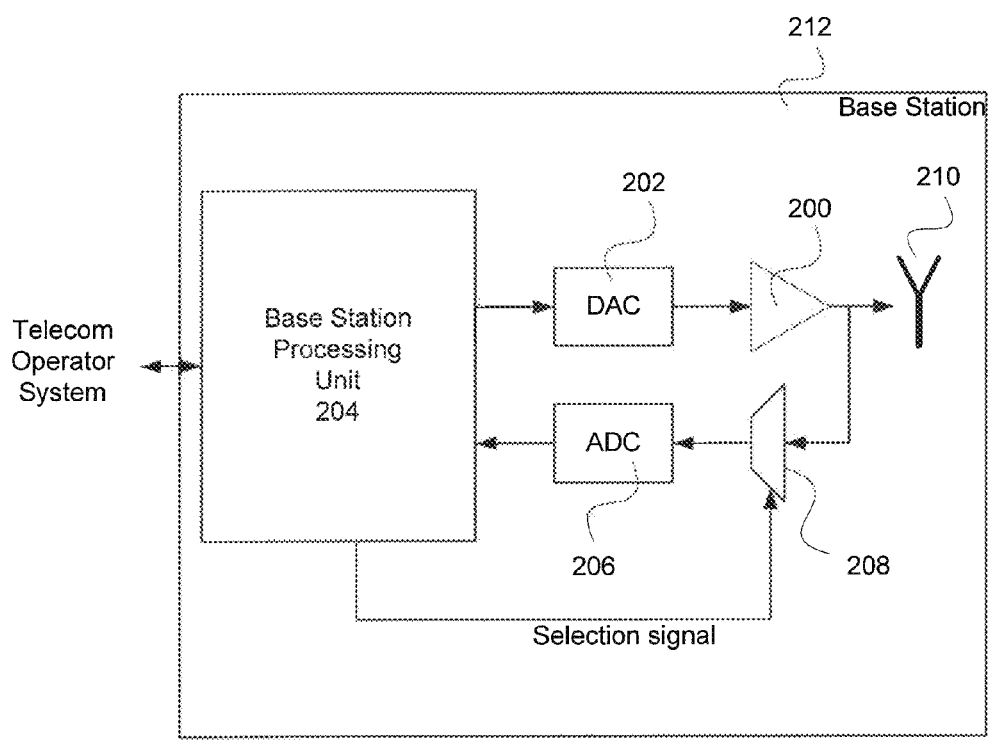
FIG. 2 is a block diagram illustrating an embodiment of an exemplary base station processing architecture.

FIG. 2 is a block diagram illustrating an embodiment of an exemplary base station processing architecture. In the example shown, base station 212 sends a plurality of signals to external devices (e.g., mobile phones). A feedback signal corresponding to a signal being sent to a particular antenna is sampled through selection hardware 208 (e.g., a multiplexer) and fed into analog-to-digital converter 206. In some embodiments, selection hardware 208 is controlled by base station processing unit 204 using a selection signal output that selects the appropriate signal from amplifier 200 (or a plurality of amplifiers 200). Once converted to digital format, the feedback signal is processed by base station processing unit 204, which is connected to the wider telecom operator system. Using the feedback signal to linearize its output, base station processing unit 204 sends a plurality of signals received from the telecom operator system out to external devices. The plurality of signals is processed by base station processing unit 204 and is then sent to digital-to-analog converters 202. After conversion to analog, the plurality of signals are then amplified by amplifier 200 and sent to antenna 210 for transmission.

Figure 3:
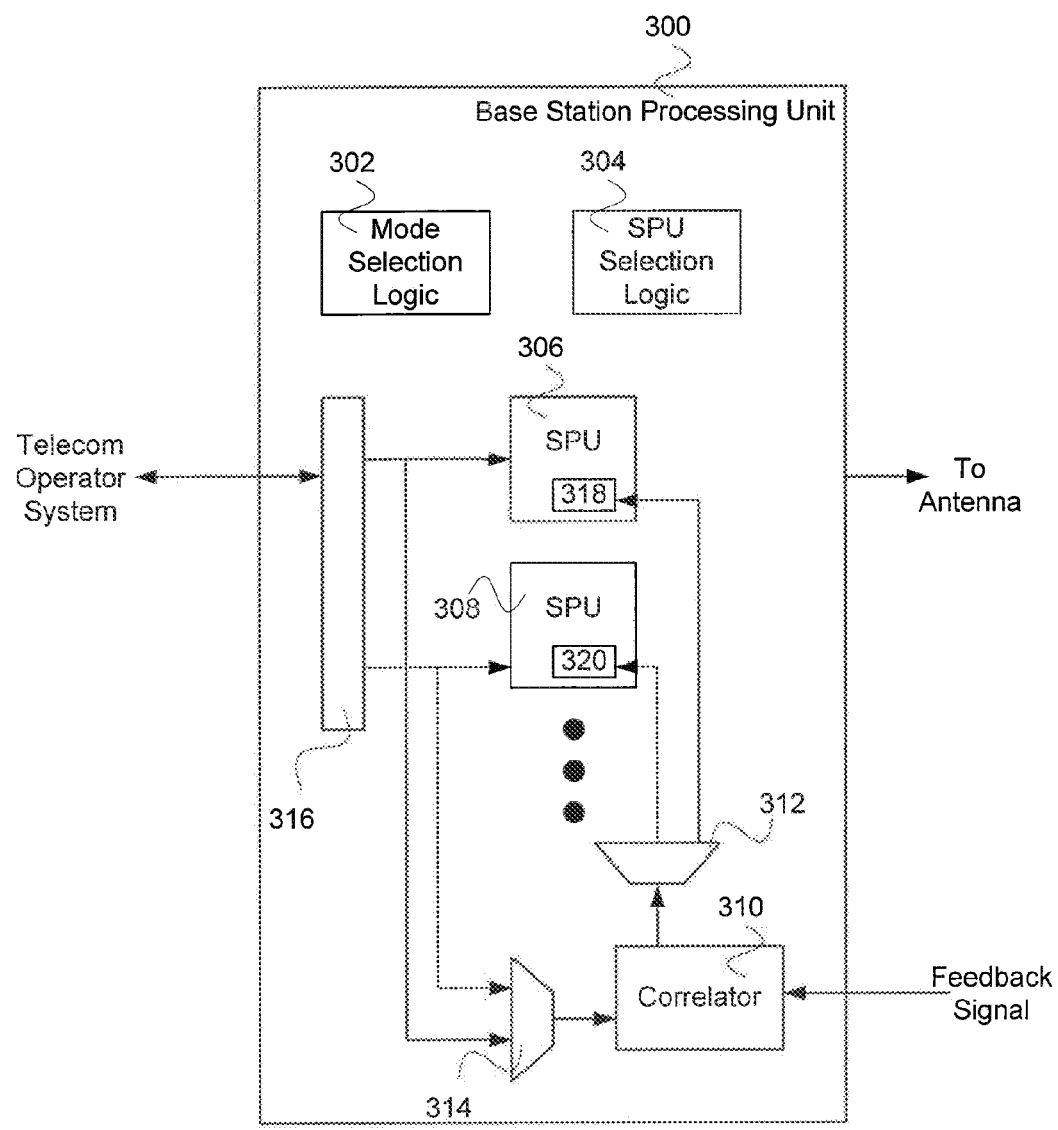
FIG. 3 is a block diagram illustrating an embodiment of an example of a base station processing unit.

FIG. 3 is a block diagram illustrating an embodiment of an example of a base station processing unit. In the example shown, base station processing unit 300 comprises mode selection logic 302, signal processing unit (SPU) selection logic 304, SPU 306, SPU 308, and correlator 310. Base station processing unit 300 receives signals from a telecom operator system and outputs to an antenna (e.g., through digital to analog converters and amplifiers). Base station processing unit 300 receives a feedback signal of one of the outputs as selected by selection hardware (e.g., based on a time division rotation/schedule of the plurality of output signals to the antenna—for example, selecting a first channel for a fixed period of time enabling the taking of multiple samples, then selecting a next channel for a second fixed period of time enabling the taking of multiple samples). Mode selection logic 302 selects a mode for base station processing unit 300 whereby base station processing unit 300 is able to process a number of signals corresponding to the selected mode (e.g., one signal, two signals, four signals, or more signals). SPU selection logic 304 selects SPU units to associate with input signals. For example, 14 SPUs are used to process a single channel (e.g., each SPU takes a group of samples and processes them); 14 SPUs are used to process a single channel where 7 SPUs process half of the samples and 7 SPUs process the other half of the samples (e.g., odd samples and even samples); 7 SPUs process a first channel and 7 SPUs process a second channel; 3 SPUs process a first channel, 3 SPUs process a second channel, 3 SPUs process a third channel, and 3 SPUs process a fourth channel; or any other appropriate combinations of SPUs are used to process respective channels.

In some embodiments, selection switch 316 routes input signals from the Telecom Operator System to the appropriate SPUs based on the mode selection logic and the SPU selection logic.

In some embodiments, correlator 310 receives a feedback signal and a reference signal. The feedback signal comprises samples of amplifier output (e.g., from amplifier 200, FIG. 2) associated with a given channel. The reference signal comprises input data signal values selected using selector 314 associated with the same given channel. Correlator 310 uses feedback signal and the reference signal to calculate an error signal, which in turn is used to generate a correction for that channel. The correction is provided, using selector 312, to a correcting unit associated with an SPU (e.g., correcting unit 318 of SPU 306 or correcting unit 320 of SPU 308). The correction is provided to the SPUs processing the given channel. Correlator 310 then receives samples of a different amplifier output associated with a different channel, which in turn are used to generate a correction for that different channel. The correction is provided to the SPUs processing the different channel. The received sampling of the outputs and the calculation of the correction as well as the providing of the correction to the appropriate channel are synchronized with appropriate accounting for delays associated with the electronics (e.g., A/D conversion, propagation, etc.), as well as calculation delays (e.g., calculation of correction parameters for linear and/or nonlinear processors associated with a channel as part of SPU processing of the channel).

In some embodiments, mode selection logic 302 controls whether the system operates in a single-channel mode, multichannel mode, other mode, or controls any other potential valid state of the device necessary for proper operation. In some embodiments, signal processing unit (SPU) selection logic 304 controls the selection of a particular signal processing unit within the bank of signal processing units, as necessary to allow proper operation with correlator 310. In various embodiments, mode selection logic 302 and SPU selection logic 304 are implemented as a single logic circuit, are implemented as circuits distributed within other elements of the base station processing unit 300, or in any other configuration that allows proper system operation. In some embodiments, a single-channel mode comprises a mode in which sets of signal processing units each process interleaved samples of a single input channel to achieve an effective higher sampling rate than the signal processing units' processing rate. In some embodiments, a multi-channel mode comprises allocating respective subsets of signal processing units to respective channels of a plurality of channels, where each subset of signal processing units processes a time division chunk of the signal of the channel at the effective rate of the signal processing units' processing rate.

Figure 4:
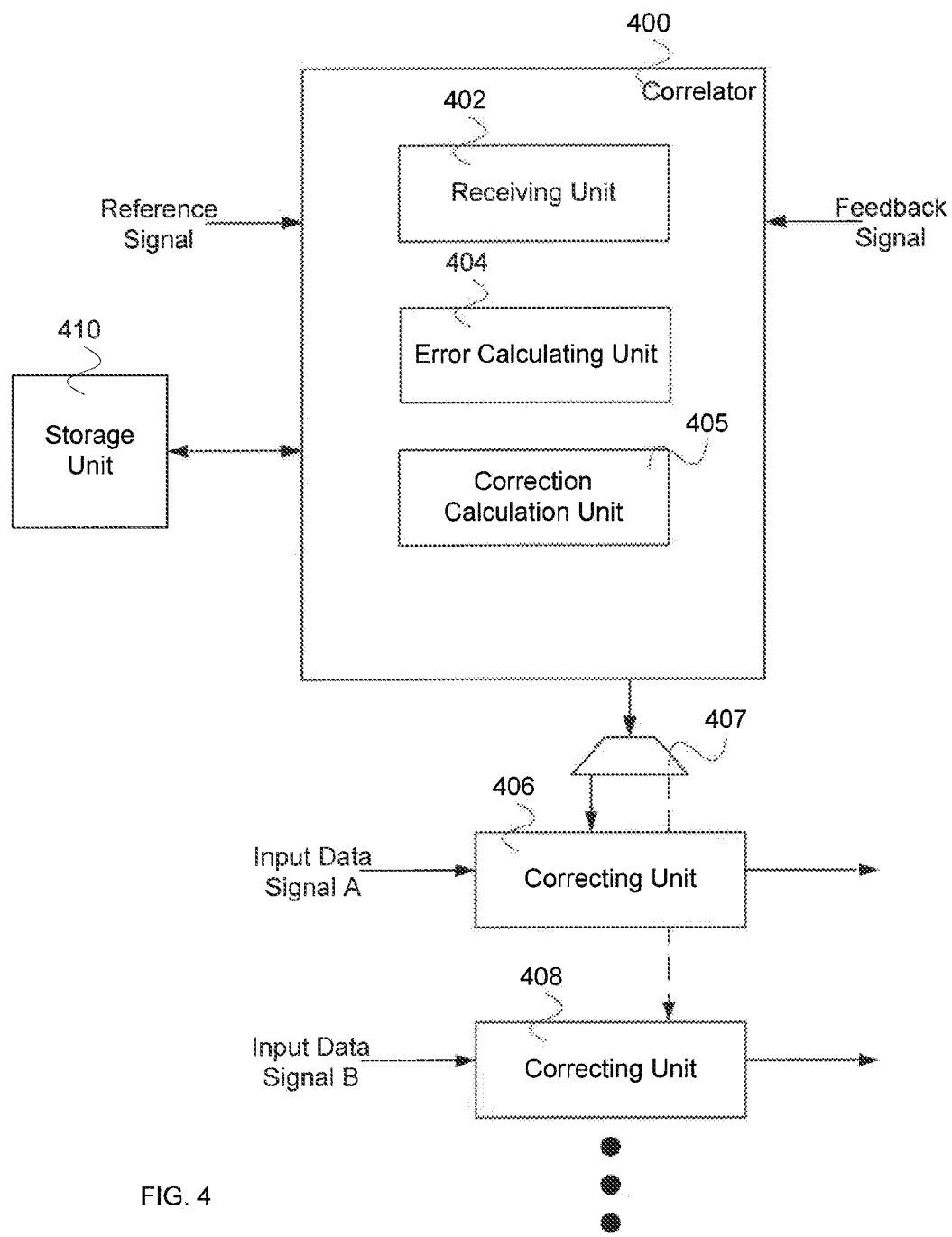
FIG. 4 is a block diagram illustrating an embodiment of a correlator.

FIG. 4 is a block diagram illustrating an embodiment of a correlator. In the example shown, correlator 400 comprises receiving unit 402 and error calculating unit 404. Correlator 400 provides a correcting signal or correcting parameters for correcting an input data signal to each of a plurality of correcting units. For example, input data signal A is processed using correcting unit 406 (e.g., associated with and/or as part of an SPU) to linearize input data signal A. Or, for example, input data signal B is processed using correcting unit 408 (e.g., associated with and/or as part of a SPU) to linearize input data signal B. In some embodiments, a multiplexer (e.g., multiplexer 407) is used to select a correcting unit that the correcting signal or that the correcting parameters or set of parameters is sent to. Correlator 400 receives a feedback signal which is selected and sampled from one of a plurality of outputs after being amplified. Receiving unit 402 associates the feedback signal with the appropriate reference signal and an error is calculated between the ideal output (e.g., as provided by the reference signal) and the feedback signal by error calculating unit 404. Details of how to determine the ideal output based on the reference signal are outside the scope of this application. The context for the reference signal and feedback signal are stored and recalled appropriately so that processing for a given selected channel is picked up from a previous processing time when the channel is reselected. In some embodiments, the reference signal comprises an input data signal to a correcting unit in an SPU—for example, input data signal A or input data signal B. Correction calculation unit 405 uses the error signal to generate a correcting signal and/or a set of parameters used to correct an input data signal. The correcting signal and/or the set of correcting parameters are provided such that the input signal is corrected for linear and/or nonlinear errors introduced by the signal processing and/or amplification. In a multi-channel mode, the time division usage of correlator 400 enables the correcting of multiple input data signals to a base processing unit using a single correlator unit. This is achieved by sharing the processing resources of the single correlator unit (e.g., correlator 400) over time to generate the correcting signals/parameters for each of the multiple input signals. In some embodiments, correlator 400 performs a receive function, delay alignment, error calculation, and a correction calculation (e.g., for which an update or adaptation block uses the error calculated between the feedback signal and a reference signal to calculate new correction coefficients).

In some embodiments, correlator 400 samples feedback of a signal (e.g., selects samples in a stream of samples) that was converted to a digital signal at the output of an amplifier (e.g., amplifier 200 of FIG. 2, not shown in FIG. 4). Once sampled, the feedback is analyzed by error calculating unit 404 (e.g., by determining an error by calculating the difference between the feedback and a reference signal). Correction calculation unit 405 then generates a correcting signal or a set of correcting parameters and provides the correcting signal, through a feedback channel using a selector (e.g., multiplexer 407), to a correcting unit (e.g., correcting unit 406, correcting unit 408, etc.) which is associated with a signal processing unit in the signal processing unit bank. The functions and elements of correlator 400 are organized in varying numbers and types of units, and those functions and elements of correlator 400 are thus not limited to receiving unit 402, error calculating unit 404, and correction calculation unit 405.

In various embodiments, storage unit 410 comprises a solid-state, magnetic, integrated circuit memory, random access memory, dynamic random access memory, chip registers, or any other type of memory capable of storing the state of correlator 400 including each of the subunits of correlator 400 enabling correlator 400 to switch contexts when switching processing between one of a plurality of input data signals to the base processing unit and when providing a correcting signal to one of a plurality of input data signals. The state of correlator 400 is stored in storage unit 410. The state stored in storage unit 410 comprises a context of the processing of a signal as fed back and sampled for which an error is generated and for which a correcting signal and/or a set of correcting parameters is generated. Respective contexts thus correspond to respective feedback signals, which are associated with input signals and the input signals' associated SPUs or sets of SPUs. The correcting signal and/or set of correcting parameters are used to correct the same signal as is associated with the signal that was originally associated with the feedback signal. The context enables prior knowledge of the signal and/or prior knowledge of the correcting signal and/or correcting set of parameters to be used to generate better correcting signals and/or correcting sets of parameters for a next sampled signal from an amplified version of the signal. In some embodiments, the amplified version of the signal has linear and/or nonlinear distortion that is to be corrected using a correcting signal and/or a correcting set of parameters. A storage channel is connected between correlator 400 and storage unit 410 to receive and transmit a state (e.g., a context state, associated channel information, time information, etc.) between storage unit 410 and correlator 400.

In some embodiments, the feedback channel comprises the connection to the output of amplifier 200 (or a plurality of amplifiers 200), selection hardware 208, ADC 206, correlator 400, multiplexer 407, and a correcting unit (e.g., correcting unit 406, correcting unit 408, etc.).

Figure 5:
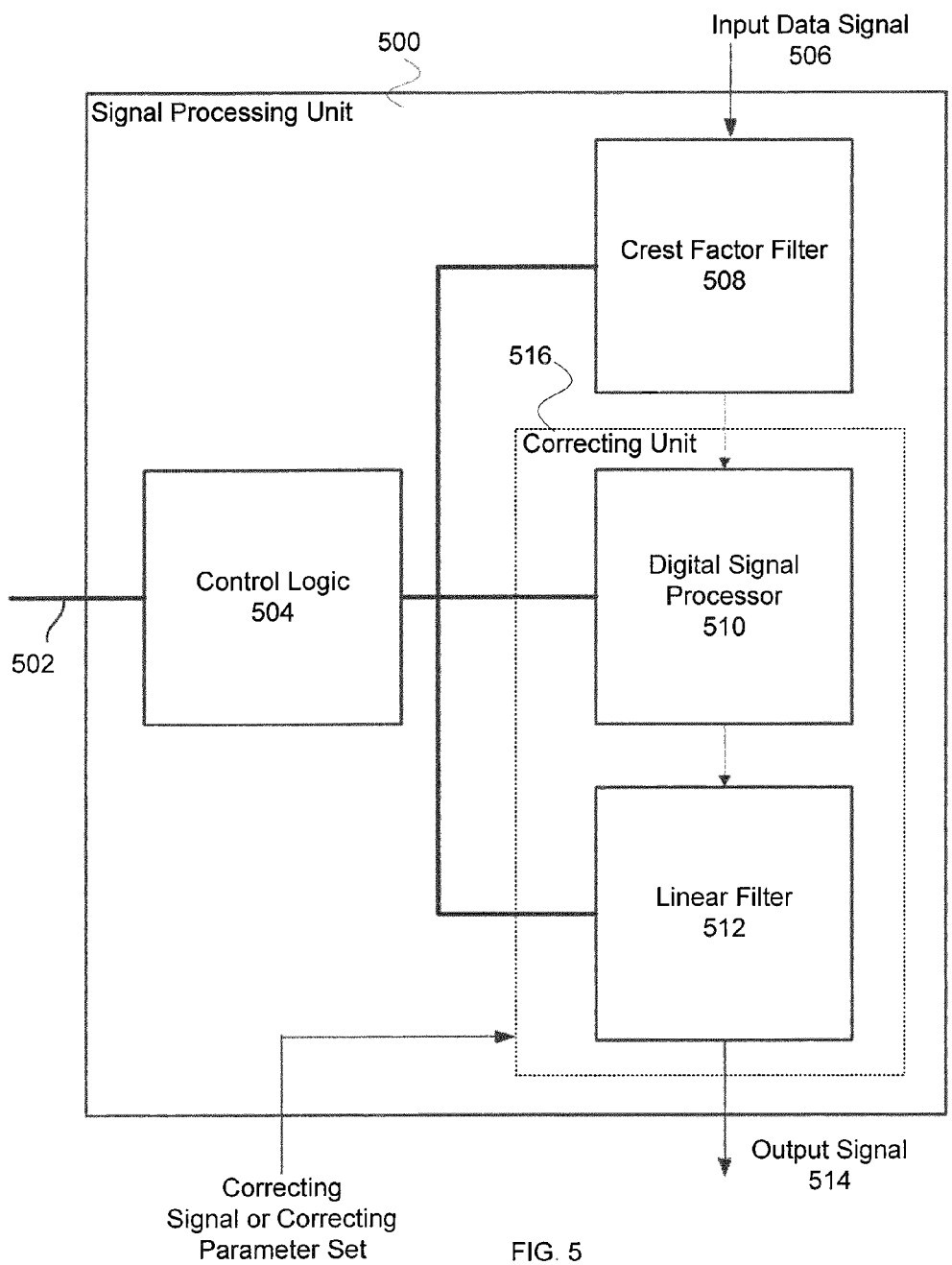
FIG. 5 is a block diagram illustrating an embodiment of a signal processing unit.

FIG. 5 is a block diagram illustrating an embodiment of a signal processing unit. In the example shown, signal processing unit 500 comprises control logic 504, crest factor filter 508, digital signal processor 510, and linear filter 512. Signal processing unit 500 communicates input data signal 506 to crest factor filter 508. Crest factor filter 508 processes input data signal 506 using a configurable squelching engine that reduces a signal's peak-to-average power ratio (PAR) while maintaining acceptable error vector magnitude (EVM). Crest factor filter 508 enables better efficiency from a power amplifier following the SPU 500 by removing peaks and thus putting more of the signal at higher power without unduly affecting signal properties. Digital signal processor 510 and linear filter 512 reduce distortion at the output of an amplifier. In some embodiments, correcting unit 516 of signal processing unit 500 comprises digital signal processor 510 and linear filter 512. In some embodiments, correcting unit 516 receives the correcting signal or a set of correcting signal parameters that are used to reduce distortion. In some embodiments, digital signal processor 510 and linear filter 512 run in parallel to reduce linear and nonlinear distortion in the final output signal. Output signal 514 is output to the amplifier. Output of the amplifier is sampled and fed back to a correlator (e.g., correlator 400, FIG. 4) that calculates a correcting signal or a set of correcting signal parameters that are used by digital signal processor 510 and/or linear filter 512 to correct one or more channels. In some embodiments, digital signal processor 510 and linear filter 512 run in parallel to reduce linear and nonlinear distortion in the final output signal. The fed-back output signals of the amplifier are digitized in a time division such that each of the output signals is sampled and appropriately processed to be able to generate a correcting signal or correcting signal parameter sets for each of the channels. In some embodiments, the distortion in each of the signal channels is due to nonlinear properties of the amplifier and/or other portions of the signal processing chain of the channel. Control logic 504 receives input 502 for configuration of signal processing unit 500 including the time division information for processing correcting signal or correcting parameter sets that are to be applied to the input signal, enabling a reduced distortion at the output of an amplifier associated with output signal 514.

Figure 6:
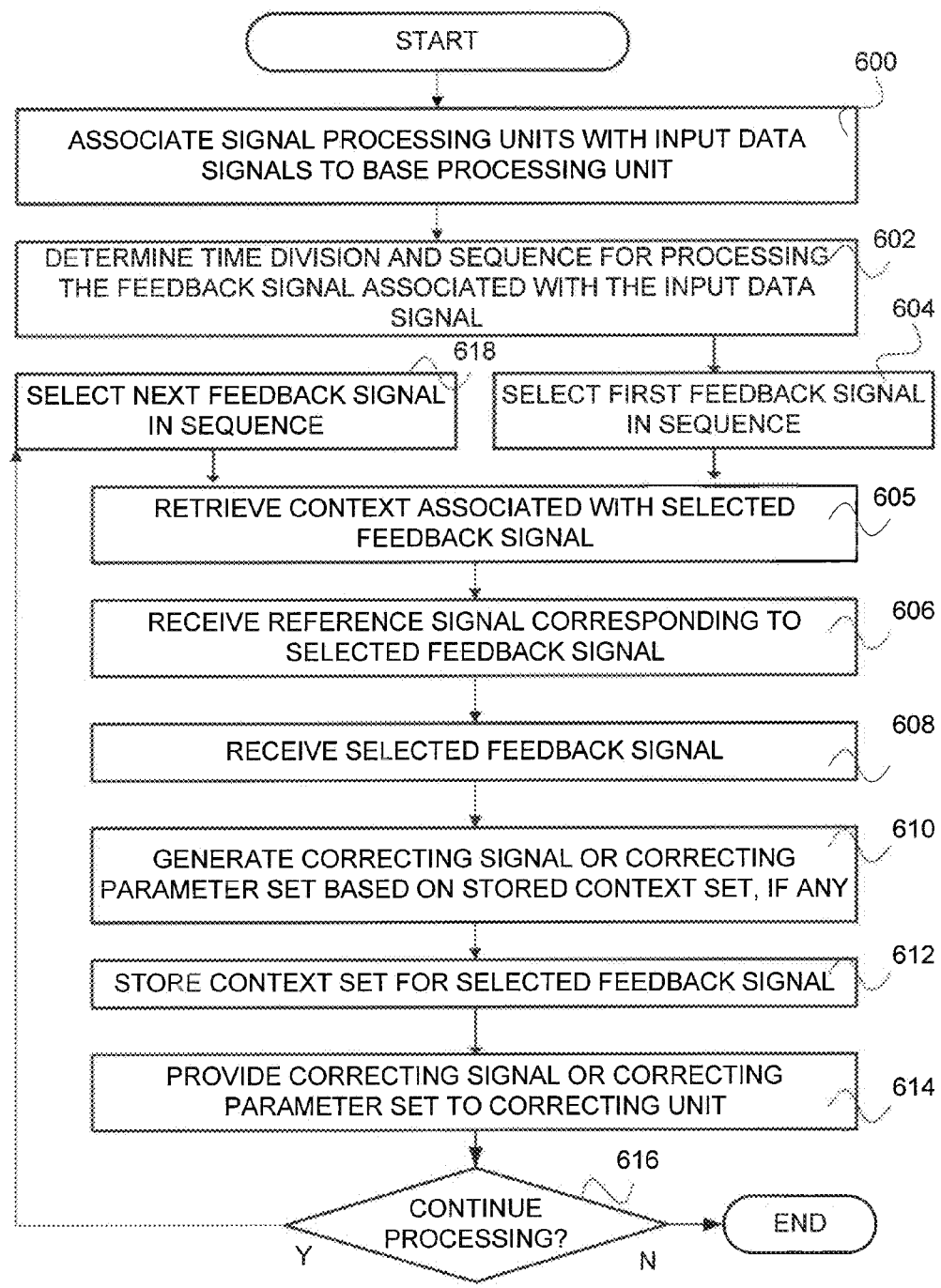
FIG. 6 is a flowchart illustrating an embodiment of an error correction system including context switching.

FIG. 6 is a flowchart illustrating an embodiment of an operation of an error correction system (e.g., as illustrated in FIGS. 2-5) including context switching. In the example shown, in 600, signal processing units are associated with input data signals to a base processing unit. For example, input data signal A to the base processing unit is associated with signal processing units 1, 2, and 3; input data signal B to the base processing unit is associated with signal processing units 4, 5, and 6.

In 602, a time division and sequence for processing the feedback data signal associated with the input data signal are determined. In some embodiments, the time division and sequence comprise a cycling of the feedback signals in order (e.g., a first feedback signal for a time T, a second feedback signal for a time T, a third feedback signal for a time T, etc.).

In 604, a first feedback signal is selected in the sequence. For example, a multiplexer is set to select the appropriate feedback signal, which is converted to digital and is input to a correlator.

In 605, the context associated with the selected feedback signal is retrieved. For example, the retrieved context (e.g., retrieved from a storage unit) enables prior knowledge of the feedback and reference signals and/or prior knowledge of the correcting signal and/or correcting set of parameters to be used to generate better correcting signals and/or correcting sets of parameters for a next sampled feedback signal.

In 606, a reference signal corresponding to the selected feedback signal is received. In some embodiments, the reference signal comprises a signal at an input of an SPU (e.g., input data signal A of FIG. 4), where the SPU is processing the input data signal corresponding to the feedback signal. In some embodiments, the reference signal is received at the correlator (e.g., see FIG. 4).

In 608, a feedback signal corresponding to the selected SPU is received. For example, the selected feedback signal and the reference signal are used by the correlator (e.g., at the correlator 400, FIG. 4) to determine an error signal. In some embodiments, an analog output signal of an amplifier (e.g., amplifier 200 of FIG. 2) is converted to a discrete time signal and fed back to the correlator. In some embodiments, the correlator uses the error signal to determine a correcting set of tap weights, which in turn are used by a correcting unit in a SPU for correcting linear and nonlinear error from the input data signal being processed by the SPU.

In 610, a correcting signal or a correcting parameter set is generated based on a stored context set, if any. For example, the stored context set is loaded from a storage unit into the correlator (e.g., storage unit 410 and correlator 400 of FIG. 4). The correlator receives the reference and feedback signals of operations 606 and 608, generates an error signal from the received signals and the loaded context set, and uses the error signal to determine a correcting set of tap weights that are used in the correcting unit of a SPU for correcting linear and nonlinear error from the input data signal associated with the SPU. The stored context set includes information stored regarding previous correcting signals, correcting parameter sets, previous sampled input signals, previous sampled feedback signals (e.g., sampled amplifier output signals), and/or any other appropriate signals or information associated with the selected feedback signal.

In 612, a context set for the selected feedback signal is stored. For example, after the correcting signal or correcting parameter set is generated and provided to correcting units of SPUs, the context set is updated accordingly and stored in a storage unit (e.g., storage unit 410).

In various embodiments, context information or context state comprises a prior correcting parameter set or prior correcting signal state (e.g., a correcting parameter set as of the last time the correlator generated the correcting parameter set associated with the given feedback signal or similarly a state or representation of the correcting signal value as of the last time the correlator generated the correcting signal associated with the given feedback signal), a prior feedback signal state, a prior correction calculation state (e.g., values, sums, coefficients for calculations of correcting signals or of correcting parameter sets as of the last time the correlator calculated for the given feedback signal), a delay parameter between a reference signal and a feedback signal, a step size for adjustment of tap weights or coefficients, or any other appropriate context data. In some embodiments, context information comprises running totals, intermediate results, and/or integration calculation values for calculations performed by the correlator. For example, the correlator receives a signal that is feedback from a sending antenna that has been digitized. The digitized feedback signal is decoded so that an error signal can be derived. In some embodiments, the digitized feedback signal is compensated for amplitude or power and/or offset variations. In some embodiments, context information is stored regarding compensation systems for amplitude or power and/or offset variations. In some embodiments, the digitized feedback signal has an associated carrier signal that is tracked for demodulation or decoding. In some embodiments, context information is stored regarding demodulation or decoding systems. In some embodiments, the correlator decodes the digitized feedback signal so that it can be aligned with a corresponding source signal or reference signal (e.g., an input data signal received at a SPU) to calculate an error signal. Coefficients for linear and nonlinear correctors are adjusted (e.g., using gradient descent to adjust coefficients to target minimizing the error). In various embodiments, coefficients are adjusted for the linear correction system in real time for a period of time and then for a period of time on the nonlinear correction system in real time, coefficients are adjusted for both linear and nonlinear correction systems simultaneously, or coefficients are adjusted in any other appropriate manner.

In 614, the correcting signal or correcting parameter set is provided to the correcting unit. For example, the correcting signal or correcting parameter set (e.g., tap weights) is updated in a correcting unit of a SPU. The updated correcting unit is used to process the input data signal. The processing of the correcting unit corrects for linear and nonlinear distortion as they appear at the output of the base station (e.g., after the D/A converters, power amplifiers, antennas, etc.). As described for operations 606-610, the distortion is measured by comparing the output of the base station to the input data signal.

In 616, it is determined whether processing continues. In the event that processing continues, control passes to 618 and a next feedback signal is selected in sequence (e.g., in a round-robin sequence). In the event that processing is not to continue, the process ends.

In some embodiments, the signals being processed by respective SPUs are continuously corrected using the respective parameter sets last updated by the feedback channel (e.g., by the correlator 400 in the feedback channel). In some embodiments, the process of FIG. 6 is repeated for one or more signal channels, where each signal channel is associated with a respective set of SPUs. In various embodiments, the process of FIG. 6 is repeated for all the signal channels, for each of the signal processing units, or any other appropriate number of iterations of the process. In various embodiments, the process of FIG. 6 selects the appropriate context state to recall based on an associated signal processing unit, channel, signal channel, input signal, or any other appropriate association.

In some embodiments, the rate at which the correcting signals or correcting parameter sets are updated, referred to as the update rate, is not the same as the sample rate set for the feedback channel. For example, the update rate is a fractional rate of the feedback signal sampling rate. Both the update rate and the feedback signal sampling rate are not necessarily the same as the channel rate (e.g., the rate of processing in the signal processing units—for example, the channel rate of the digital signal processor in an SPU). In some embodiments, the correlator is shared among more than one feedback signal and its associated SPUs, so that there may be a long period where there is no updating of the parameters for the correction of reducing distortion for a respective SPU associated with the feedback signal.

Figure 7:
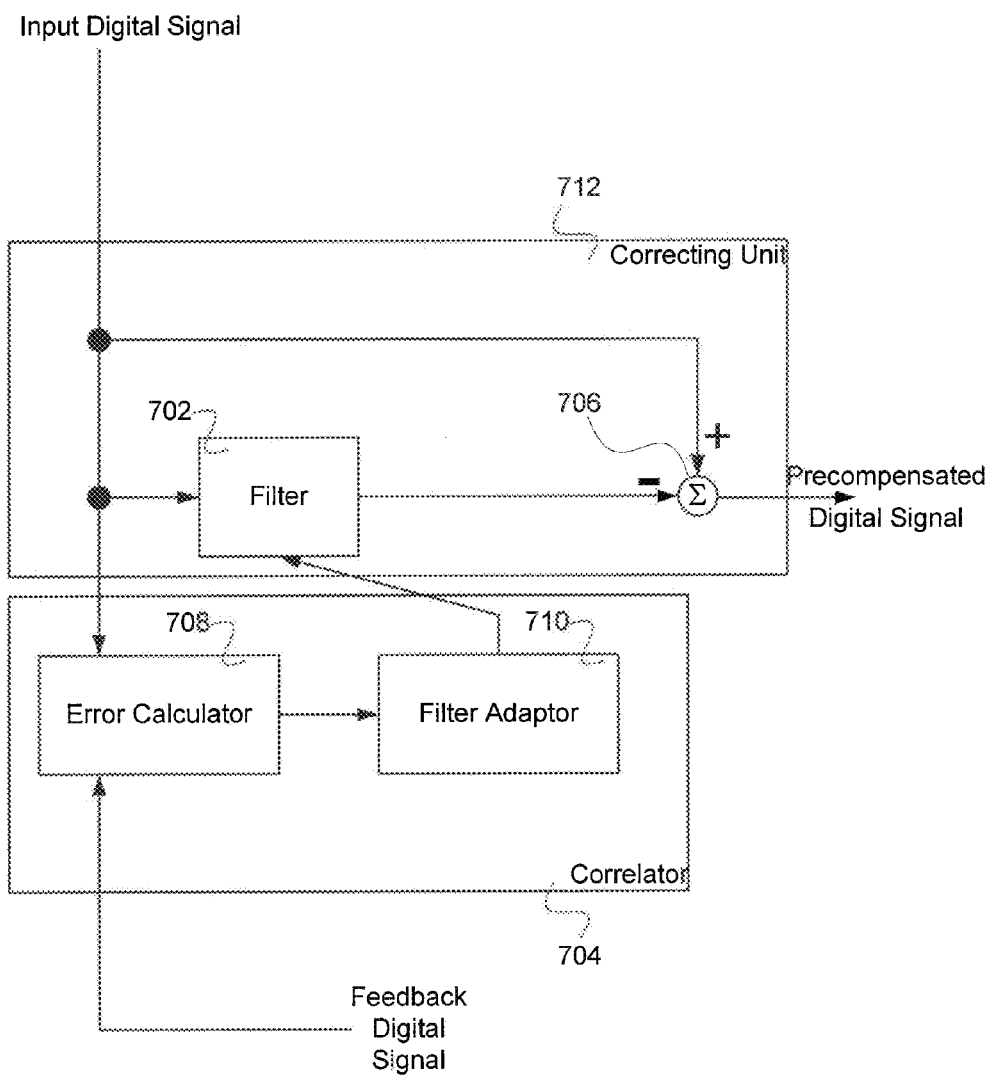
FIG. 7 is a block diagram illustrating an embodiment of a filter used in a correcting unit.

FIG. 7 is a block diagram illustrating an embodiment of a filter used in a correcting unit. In the example shown, correlator 704 receives an input data signal and a feedback digital signal and determines an error using error calculator 708. The error is used to adapt filter 702 in correcting unit 712. The input data signal is processed to precompensate the signal so that once the precompensated signal passes through the rest of the channel (e.g., digital-to-analog converter, power amplifier, etc.), the output signal minimizes the error signal. In other words, the output signal is what is desired given the input signal. In some embodiments, the precompensated digital signal comprises the input digital signal with a filtered version of the input digital signal subtracted from it using summer 706. Filter adaptor 710 adapts filter 702 in real time as error signals are fed in.

Figure 8:
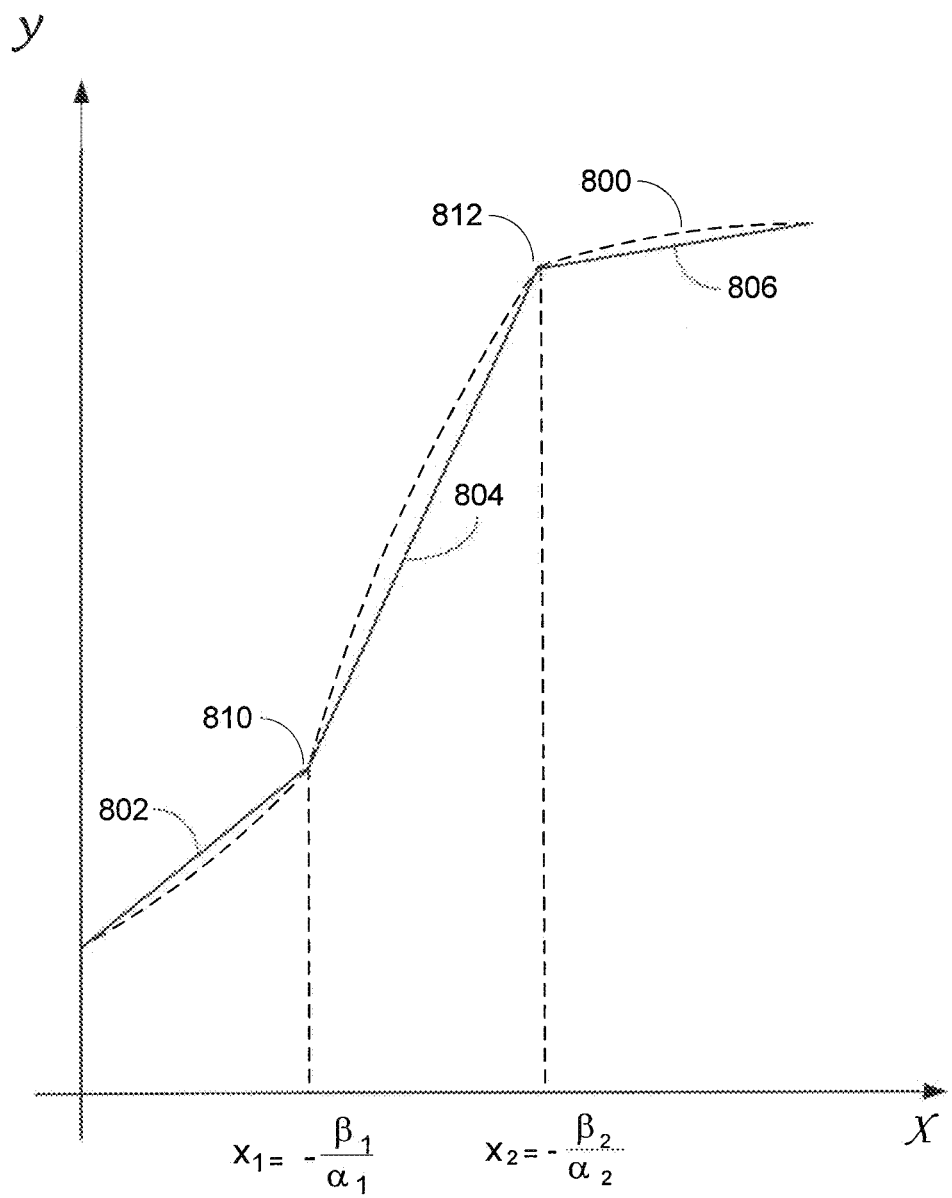
FIG. 8 is a chart illustrating one approach to the approximation of a nonlinear function according to the present application.

FIG. 8 is a chart illustrating one approach to the approximation of a nonlinear function according to the present application. A nonlinear function 800 (shown as a dashed line) is approximated by linear segments 802, 804, and 806. The linear segments are derived using techniques such as least mean square fit. The resulting approximation function is:

$$y = a \cdot x + b_0 + c_1|\alpha_1 \cdot x + \beta_1| + c_2|\alpha_2 \cdot x + \beta_2| \quad \text{(Equation 1)}.$$

This function can be implemented using linear filters and nonlinear elements. The parameters of the linear filters are determined by the parameters in the function. It should be noted that the approximation function remains nonlinear due to the absolute value operations. Break points 810 and 812 are locations where the slopes of the segments change, and they correspond to x values of $-\beta_1/\alpha_1$ and $-\beta_2/\alpha_2$, respectively. The difference between the slopes of segments 802 and 804 is $2c_1\alpha_1$; and the slope difference between segments 804 and 806 is $2c_2\alpha_2$.

The approximation method can be generalized to model nonlinear functions. Since the resulting approximation function is comprised of linear segments that are first order polynomials, it is less complex than the original nonlinear function that is comprised of higher order polynomials, and the corresponding filter implementation is more straightforward. It is now possible to use linear filters to implement a nonlinear filter whose transfer function approximates the original, more complex nonlinear transfer function.

It is also advantageous that the first order polynomials in the linearized function are easier to compute and manipulate than the higher order polynomials in the original nonlinear function. The simplified approximation function makes it possible to adjust the filter design to make tradeoffs, yet still keep the system stable. For example, the zeroes of a linearized function may be shifted to achieve better response time, and the poles may be adjusted to stay within the desired regions to ensure system stability. It would be more difficult to make such adjustments to a higher order nonlinear system since the poles and zeros of higher order polynomials tend to be less well behaved.

Figure 9:
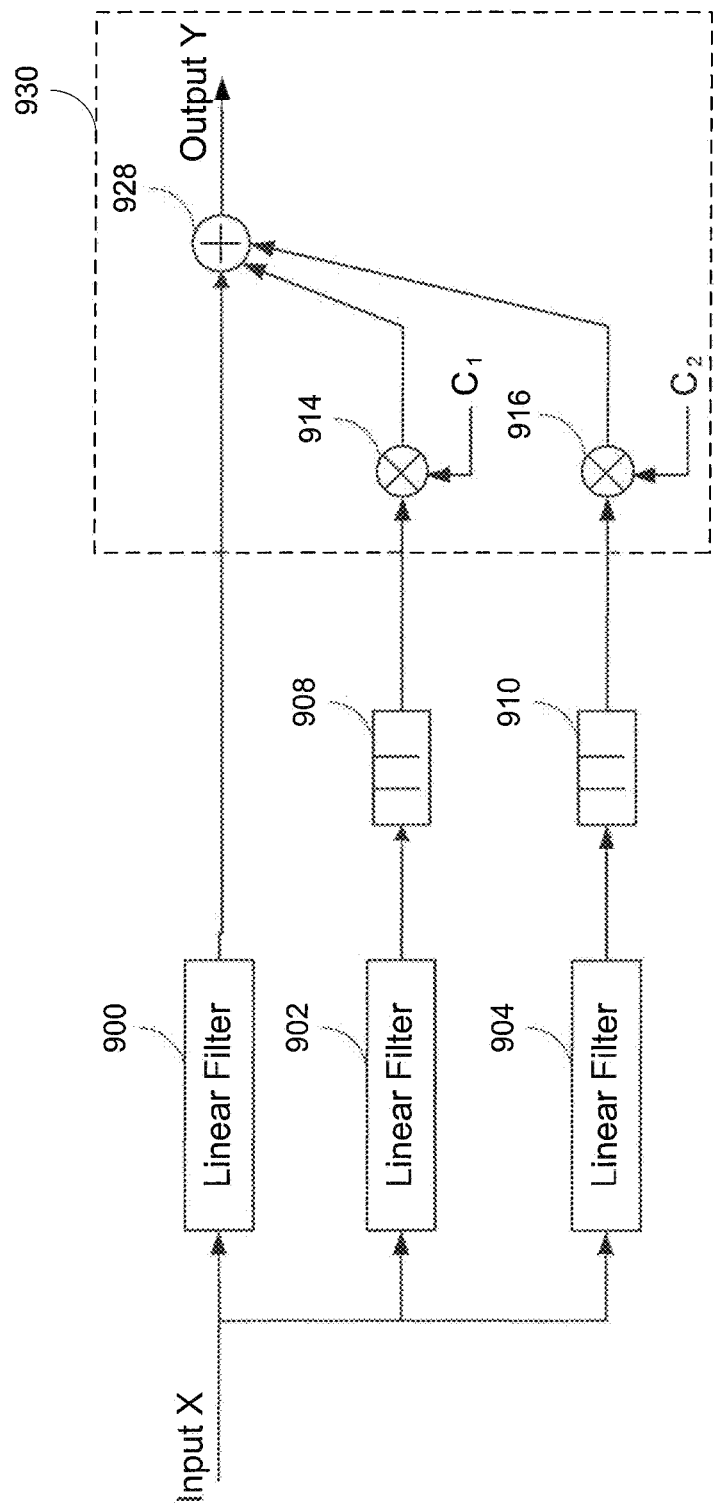
FIGS. 9 and 10 are block diagrams illustrating an embodiment of a linear filter-based nonlinear filter implementation.
Figure 10:
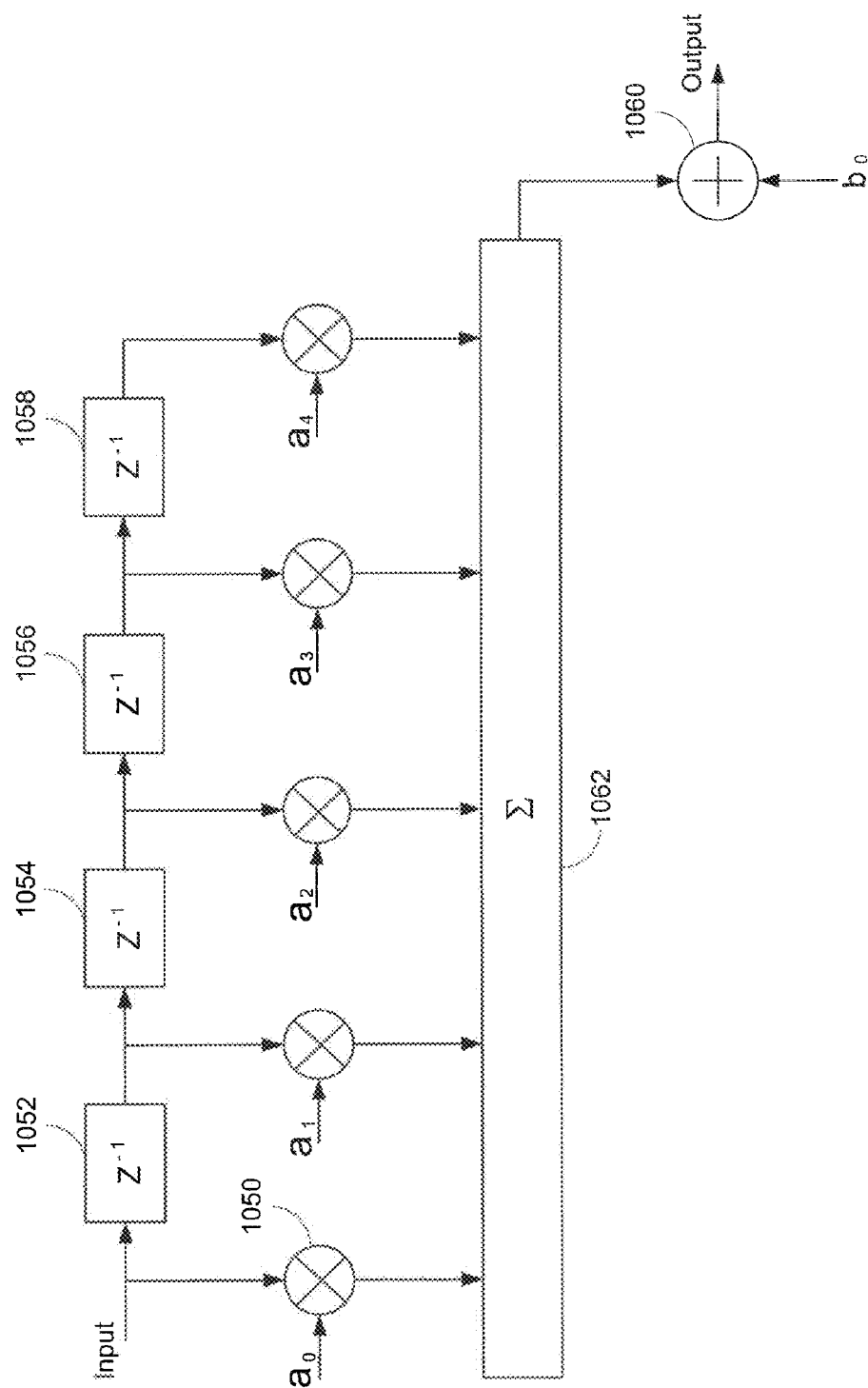

FIGS. 9 and 10 are block diagrams illustrating an embodiment of a linear filter-based nonlinear filter implementation. In the examples shown, FIG. 9 illustrates the overall architecture of the nonlinear filter. The input vector X is sent to linear filters 900, 902, and 904. The outputs of filters 902 and 904 are sent to nonlinear elements 908 and 910, respectively. A nonlinear element may be a discrete component, a part of an integrated circuit chip, a processor, or any other appropriate hardware and/or software for providing a nonlinear transformation to an input. In some embodiments, each of the nonlinear elements is an absolute value operator that applies an absolute value function to its input.

The outputs of the nonlinear elements and the output of filter 900 are combined by a combination network 930 to produce the desired transfer function. In some embodiments, the combination network is a summation network comprised of multipliers 914 and 916, and combiner 928. The outputs of nonlinear elements 908 and 910 are scaled by factors of C1 and C2, via multipliers 914 and 916, respectively. The scaled nonlinear outputs and the output from filter 900 are summed by combiner 928 to produce an output having a transfer function similar to Equation 1.

In the example shown in FIG. 10, the details of a linear filter are shown. In some embodiments, the filter of FIG. 10 is used to implement filters in FIG. 9 (e.g., filter 900). The input is scaled by a factor $a_0$ using a multiplier 1050. The input is also sent to a plurality of delay stages 1052, 1054, 1056 and 1058, and the delayed signals are scaled by factors of $a_1$, $a_2$, $a_3$ and $a_4$, respectively. The scaled signals are combined by combiner 1062. A constant value $b_0$ is added to the combined result via another combiner 1060 to generate the output. The output of the filter provides an averaging affect to the overall nonlinear filter (similar to the term $a \cdot x + \beta_0$ in equation 1), thus the filter of FIG. 10 is sometimes referred to as an averaging filter. In some embodiments, the constant value is added to the scaled signals directly by combiner 1062, thus combiner 1060 is omitted. Different types of linear filters may be employed in other embodiments.

In some embodiments, linear filters 902 and 904 shown in FIG. 9 have similar architecture as the one shown in FIG. 10, although the number of delays and the scaling factors vary for different filters. These linear filters provide other terms in the transfer function, and their absolute values are taken and combined to produce the desired output. In other embodiments, the linear filters may have different designs than what is shown in FIG. 10.

In some embodiments, a simplified nonlinear filter is used in the correcting unit of an SPU.

A nonlinear filter can be generally expressed as follows:

$$y_n = A^T V_n + b + \sum_{j=1}^{K} c_j |\vec{\alpha}_j V_n + \beta_j|. \quad \text{(Equation 2)}$$

Figure 11:
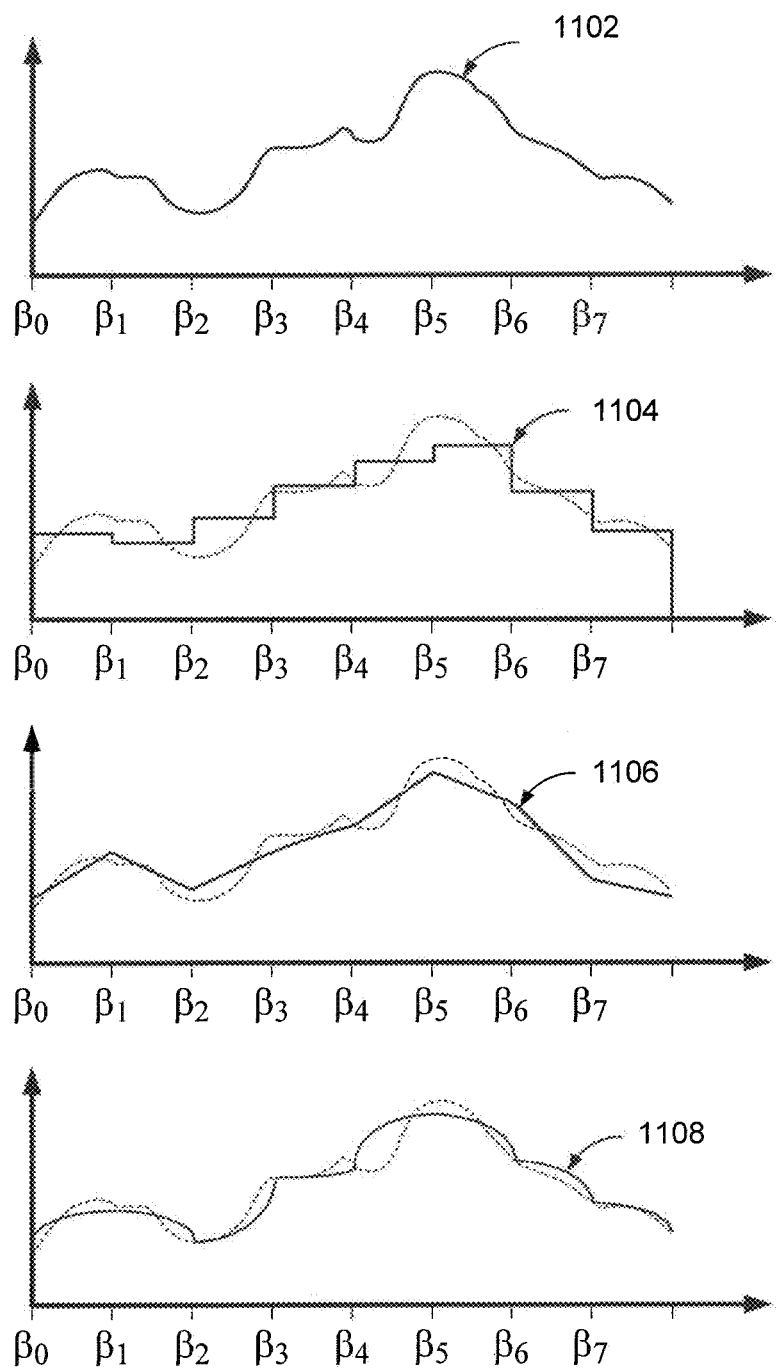
FIG. 11 is a diagram illustrating several ways of approximating a nonlinear filter response function.

FIG. 11 is a diagram illustrating several ways of approximating a nonlinear filter response function. In the example shown, the output is dependent on a one dimensional input. The techniques shown are also applicable to multi-dimensional inputs. In this example, nonlinear function 1102 can be approximated as a zero order function 1104, a first order function 1106, or a second order function 1108. As used herein, an N order function is expressed as:

$$y_n = \sum_{j=0}^{N} c_j v^j, \quad \text{(Equation 3)}$$

where $c_j$ are coefficients.

In the example shown, the input range is divided into discrete sections, marked using a set of ordered constants $\beta_0$ to $\beta_7$. The number of sections depends on factors such as performance requirements and may vary for different embodiments. The distribution of $\beta$'s across the input range may be uniform or non-uniform depending on system implementation. The zero order function 1104 is determined by approximating the transfer function in each portion of the input range (such as the input ranges between $\beta_0$ and $\beta_1$, between $\beta_1$ and $\beta_2$, etc.) using a linear, zero order function and then combining the functions. The approximation may be performed using least mean square error or other appropriate techniques to determine the suitable coefficients. Similarly, the first order approximation function 1106 is comprised of linear first order approximation functions within each portion of the input range and the second order approximation 1108 is comprised of nonlinear second order approximation functions within each portion of the input range. Higher order approximations are also possible.

The generalized nonlinear function of Equation 2 can be transformed and approximation can be made based on the transformed function. The absolute value portion of the generalized nonlinear function can be written as:

$$|\vec{\alpha}_j V_n + \beta_j| = \text{sign}(\vec{\alpha}_j V_n + \beta_j)\{\vec{\alpha}_j V_n + \beta_j\} = \lambda_{jn}\{\vec{\alpha}_j V_n + \beta_j\} \quad \text{(Equation 4)},$$

where $$\text{sign}(\vec{\alpha}_j V_n + \beta_j) = \lambda_{jn} \quad \text{(Equation 5)}.$$

Consequently, the general form of the nonlinear filter can be written as:

$$y_n = \left(a_0 + \sum_{j=1}^{K} c_j \alpha_{0,j} \lambda_{jn}\right) v_n + \ldots + \left(a_{2N-2} + \sum_{j=1}^{K} c_j \alpha_{2N-2,j} \lambda_{jn}\right) v_{n-2N+2} + \left(b + \sum_{j=1}^{K} c_j \beta_j \lambda_{jn}\right), \quad \text{(Equation 6)}$$

which is equivalent to writing:

$$y_n = \tilde{a}_{0,n}(V_n) v_n + \ldots + \tilde{a}_{2N+2,n}(V_n) v_{n-2N+2} \tilde{b}_n(V_n) \quad \text{(Equation 7)}.$$

The above equation can be viewed as a "linear" convolution between the input variables and the nonlinear coefficients that are time variant nonlinear functions of the input signal. The relative location of input $V_n$ in the multi-dimensional input space determines the values of the $\lambda_{jn}$ elements and therefore the values of the $\tilde{a}_{j,n}$ and $\tilde{b}_n$ coefficients. The dependence of the filter coefficient values on the input signal vector gives the filter its nonlinear property. The function is sometimes referred to as a first order nonlinear filter because the coefficient of each variable is a function that does not depend on the variable itself. In this case, the coefficient is a function of the sign of a function of the variable $v_{n-j}$.

Equation 7 can be rewritten in vector form as:

$$y_n = A^T V_n + b + [\, c_1 \lambda_{1n} \quad c_2 \lambda_{2n} \quad \ldots \quad c_K \lambda_{Kn} \,] \quad \text{(Equation 8)}$$

$$\left\{ \begin{bmatrix} \alpha_{0,1} & \alpha_{1,1} & \ldots & \alpha_{2N-2,1} \\ \alpha_{0,2} & \alpha_{1,2} & & \alpha_{2N-2,2} \\ & & \vdots & \\ \alpha_{0,K} & \alpha_{1,K} & \ldots & \alpha_{2N-2,K} \end{bmatrix} \begin{bmatrix} v_n \\ v_{n-1} \\ \vdots \\ v_{n-2N+2} \end{bmatrix} + \begin{bmatrix} \beta_1 \\ \beta_2 \\ \vdots \\ \beta_K \end{bmatrix} \right\}.$$

The equation shows the dependence of the coefficients on $\lambda_{jn}$.

Once written in vector form, the filter can be further manipulated to achieve computational reductions. For example, the vector form can be rewritten as:

$$y_n = A^T V_n + b + [\, c_1 \lambda_{1n} \quad c_2 \lambda_{2n} \quad \ldots \quad c_K \lambda_{Kn} \,] \quad \text{(Equation 9)}$$

$$\left\{ \begin{bmatrix} \alpha_{0,1} & 0 & \ldots & 0 \\ \alpha_{0,2} & 0 & \vdots & 0 \\ 0 & \alpha_{1,2} & 0 & 0 \\ 0 & \alpha_{1,3} & 0 & 0 \\ & & \vdots & \\ 0 & 0 & 0 & \alpha_{2N-2,K-1} \\ 0 & 0 & 0 & \alpha_{2N-2,K} \end{bmatrix} \begin{bmatrix} v_n \\ v_{n-1} \\ \vdots \\ v_{n-2N+2} \end{bmatrix} + \begin{bmatrix} \beta_1 \\ \beta_2 \\ \vdots \\ \beta_K \end{bmatrix} \right\},$$

which can be further reduced to:

$$y_n = A^T V_n + b + [\, c_1 \lambda_{1n} \quad c_2 \lambda_{2n} \quad \ldots \quad c_K \lambda_{Kn} \,] \quad \text{(Equation 10)}$$

$$\left\{ \begin{bmatrix} 1 & 0 & \ldots & 0 \\ 1 & 0 & \vdots & 0 \\ 0 & 1 & 0 & 0 \\ 0 & 1 & 0 & 0 \\ & & \vdots & \\ 0 & 0 & 0 & 1 \\ 0 & 0 & 0 & 1 \end{bmatrix} \begin{bmatrix} v_n \\ v_{n-1} \\ \vdots \\ v_{n-2N+2} \end{bmatrix} + \begin{bmatrix} \beta_1 \\ \beta_2 \\ \vdots \\ \beta_K \end{bmatrix} \right\},$$

which reduces the original equation to:

$$y_n = A^T V_n + b + \sum_{j=1}^{K_1} c_j |v_n + \beta_j| + \sum_{j=K_1+1}^{K_2} c_j |v_{n-1} + \beta_j| \ldots + \sum_{j=K_{2N-3}+1}^{K_{2N-2}} c_j |v_{n-2N+2} + \beta_j| = A^T V_n + b + \sum_{j=1}^{K_1} c_j \lambda_{j,n} (v_n + \beta_j) + \sum_{j=K_1+1}^{K_2} c_j \lambda_{j,n} (v_{n-1} + \beta_j) \ldots + \sum_{j=K_{2N-3}+1}^{K_{2N-2}} c_j \lambda_{j,n} (v_{n-2N+2} + \beta_j), \quad \text{(Equation 11)}$$

which means $$y_n = \left(a_0 + \sum_{j=1}^{K_1} c_j \lambda_{jn}\right) v_n + \ldots + \left(a_{2n-2} + \sum_{j=K_{2N-3}+1}^{K_{2N-2}} c_j \lambda_{jn}\right) v_{n-2N+2} + \left(b + \sum_{j=1}^{K} c_j \beta_j \lambda_{jn}\right). \quad \text{(Equation 12)}$$

As will be shown in more details below, equation 12 has reduced computational burden because the calculation of $\lambda_j$ does not require any multiplication. The computational savings of this function is significant compared to the generalized filter function, where a linear convolution $\vec{\alpha}_j V_n$ is performed before $\lambda_j$ is computed. Since the dependency on the input is of first order, the reduced nonlinear filter function is referred to as a first order low complexity filter function.

Other simplifications using vector manipulation are also possible. For example, $$y_n = A^T V_n + b + [\, c_1 \lambda_{1n} \quad c_2 \lambda_{2n} \quad \ldots \quad c_K \lambda_{Kn} \,] \quad \text{(Equation 13)}$$

$$\left\{ \begin{bmatrix} 1 & 0 & \ldots & 0 \\ 1 & 0 & \vdots & 0 \\ 1 & 1 & 0 & 0 \\ 1 & 1 & 0 & 0 \\ & & \vdots & \\ 0 & 0 & 0 & 1 \\ 0 & 0 & 0 & 1 \end{bmatrix} \begin{bmatrix} v_n \\ v_{n-1} \\ \vdots \\ v_{n-2N+2} \end{bmatrix} + \begin{bmatrix} \beta_1 \\ \beta_2 \\ \vdots \\ \beta_K \end{bmatrix} \right\}$$

produces a nonlinear filter $$y_n = \tilde{a}_{0,n}(v_n, v_{n-1}) v_n + \tilde{a}_{1,n}(v_n, v_{n-1}) v_{n-1} + \ldots + \tilde{a}_{2N+2,n}(v_{n-2N+2}) v_{n-2N+2} + \tilde{b}_n(v_n) \quad \text{(Equation 14)}$$

where each coefficient of the first two variables corresponds to a function of the first two variables, and each of the remaining coefficients are functions of the variable that they multiply.

Figure 12:
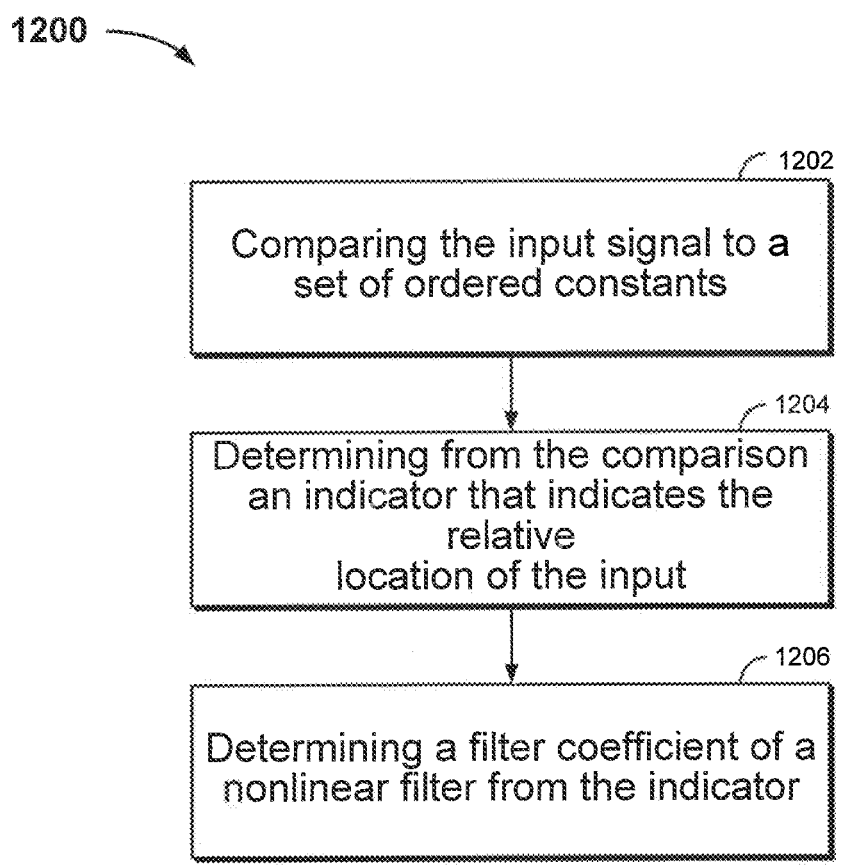
FIG. 12 is a flowchart illustrating an embodiment of the processing of an input signal.

FIG. 12 is a flowchart illustrating an embodiment of the processing of an input signal. In the example shown, process 1200 is applicable to various nonlinear filter embodiments, some of which are shown in greater detail below. An input variable of the input signal is compared to a set of ordered constants (1202). In some embodiments, the set of ordered constants are the β constants that divide the input range into multiple sections. The relative location of the input variable within the range of possible inputs is determined (1204). In some embodiments, the relative location is determined using the value of $\lambda_j$. Using the relative location, one or more filter coefficients of a nonlinear filter are determined (1206). The coefficients, which depend on the inputs, may vary over time. The coefficients can be determined without requiring multiplication operations, allowing the filter to process its inputs efficiently. In some embodiments, the nonlinear filter is used to process the input and generate the output. In some embodiments, the nonlinear filter with the derived coefficients is used as a coefficient for a higher order nonlinear filter, which is then used to filter the input and generate the output.

Figure 13:
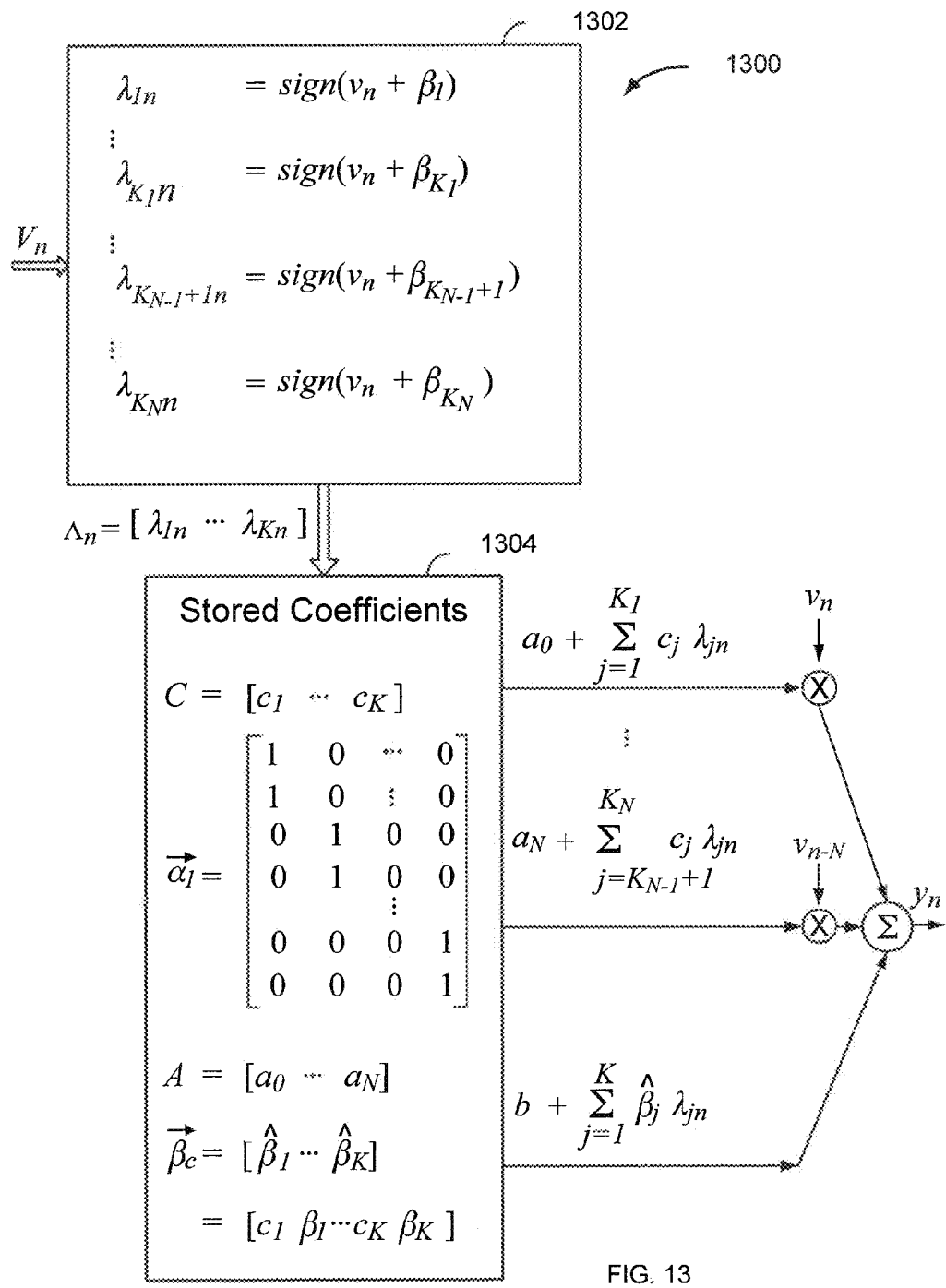
FIG. 13 is a block diagram illustrating a first order low complexity nonlinear filter embodiment.

FIG. 13 is a block diagram illustrating a first order low complexity nonlinear filter embodiment. Filter 1300 shown in this example has a transfer function that is equivalent to equation 12. The input vector $V_n$ is sent to a sign processor 1302 to generate $\lambda_{jn}$. The constant coefficients, including $c_j$, $\alpha_j$, $c_j\beta_j$ are stored in a memory 1304, which is implemented using registers or other appropriate data storage components. The first order coefficients of equation 12 are computed by multiplying π with the corresponding $c_j$, or $\beta_j$, summing the results, and adding to the corresponding constant $\alpha_j$. The coefficients are then multiplied with an input variable v if appropriate. The results of the individual first order filters are combined to generate a nonlinear output $y_n$.

Figure 14:
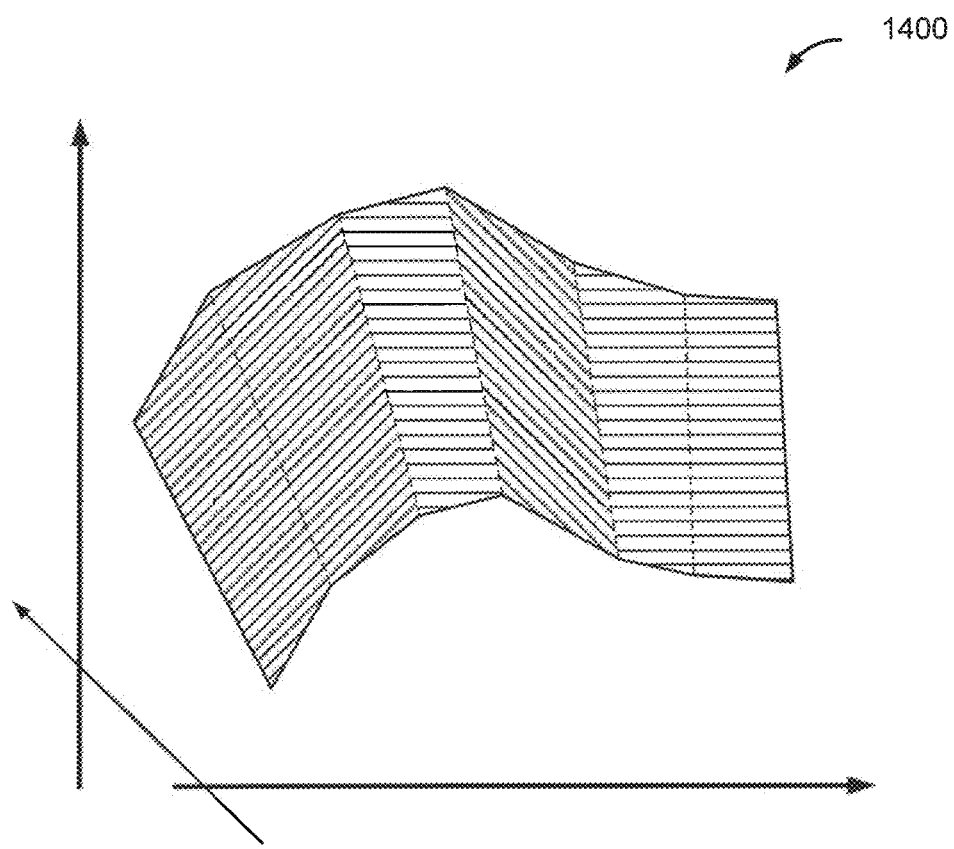
FIG. 14 is a diagram illustrating a 3-D manifold of the output of a first order nonlinear filter embodiment.

FIG. 14 is a diagram illustrating a 3-D manifold of the output of a first order nonlinear filter embodiment. In this example, filter function 1400 is a function of two input variables. The first order terms form planar segments of the manifold. Function 1400 can be used to approximate a continuous, 3-D nonlinear function. Functions involving higher dimensions can be approximated similarly.

As shown previously, the generalized nonlinear filter function of equation 2 can be transformed to a first order nonlinear filter as shown in equation 7. A further extension of the nonlinear filter transformation leads to another nonlinear filter expression:

$$y_n = f_{0,n}(V_n)v_n + \ldots + f_{2N+2,n}(V_n)v_{n-2N+2} + \tilde{a}_{0,n}(V_n)v_n + \ldots + \tilde{a}_{2N+2,n}(V_n)v_{n-2N+2} + \tilde{b}_n(V_n)$$ (Equation 15)

where each $f_{k,n}(V_n)$ is a first order nonlinear function $$f_{k,n}(V_n) = A_k^T V_n + b_k + \sum_{j=1}^{K} c_j^k |\alpha_j^k V_n + \beta_j^k| = $$ (Equation 16)

$$\tilde{a}_{0,n}^k(V_n)v_n + \ldots + \tilde{a}_{2N-2,n}^k(V_n)v_{n-2N+2} + \tilde{b}_n^k(V_n).$$

Thus, the terms of equation 15 that have $f_{k,n}(V_n)$ as coefficients are second order functions of the input variables (as used herein, a second order function includes at least one term of an input variable to the power of 2 or a cross product of input variables). In different embodiments, the coefficients may be multiplied by the input variable, a delayed input variable, a derivative of the input, or other appropriate characteristics of the input.

Figure 15:
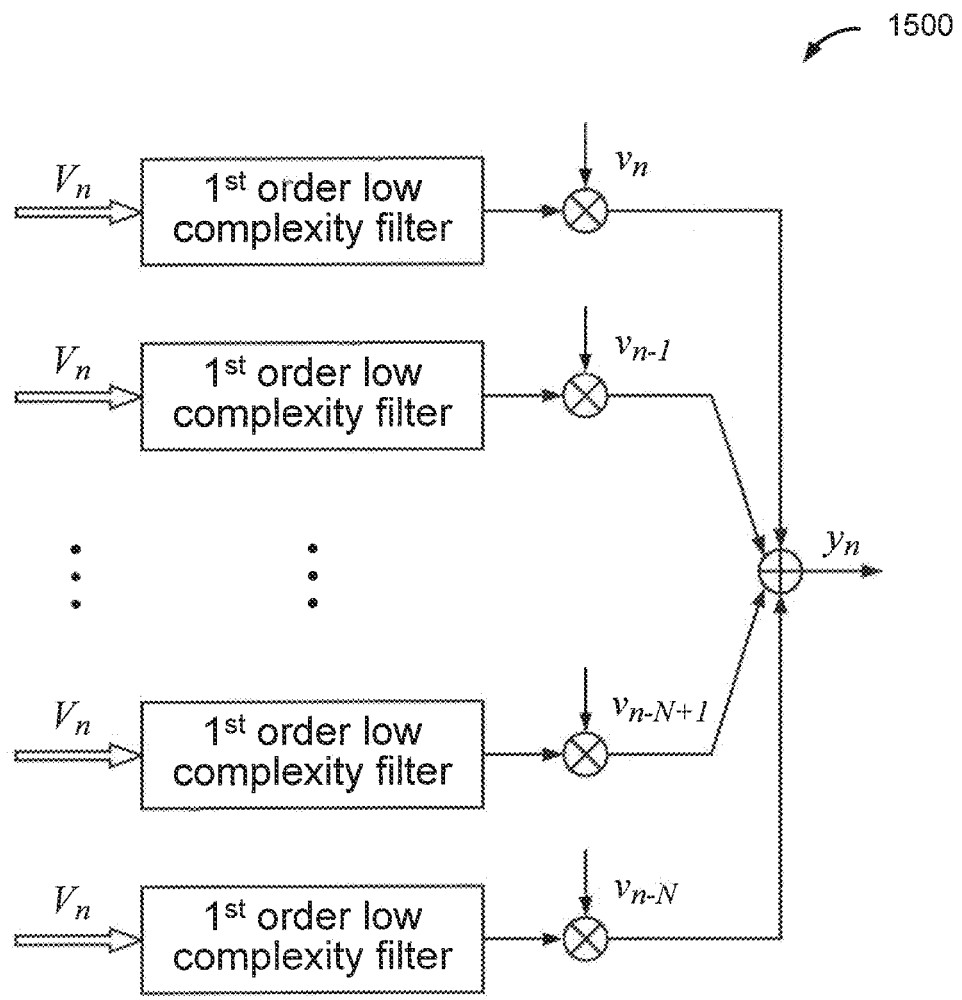
FIG. 15 is a block diagram illustrating an embodiment of a second order low complexity nonlinear filter.

FIG. 15 is a block diagram illustrating an embodiment of a second order low complexity nonlinear filter. In the example shown, second order low complexity filter 1500 is implemented using a plurality of first order low complexity filters. The coefficients of the first order low complexity filters are computed using techniques such as least mean squared error. The input vector is sent to each of the first order low complexity filters, and each of the filter outputs is multiplied with a corresponding input variable. The results are combined to generate the output $y_n$.

Figure 16:
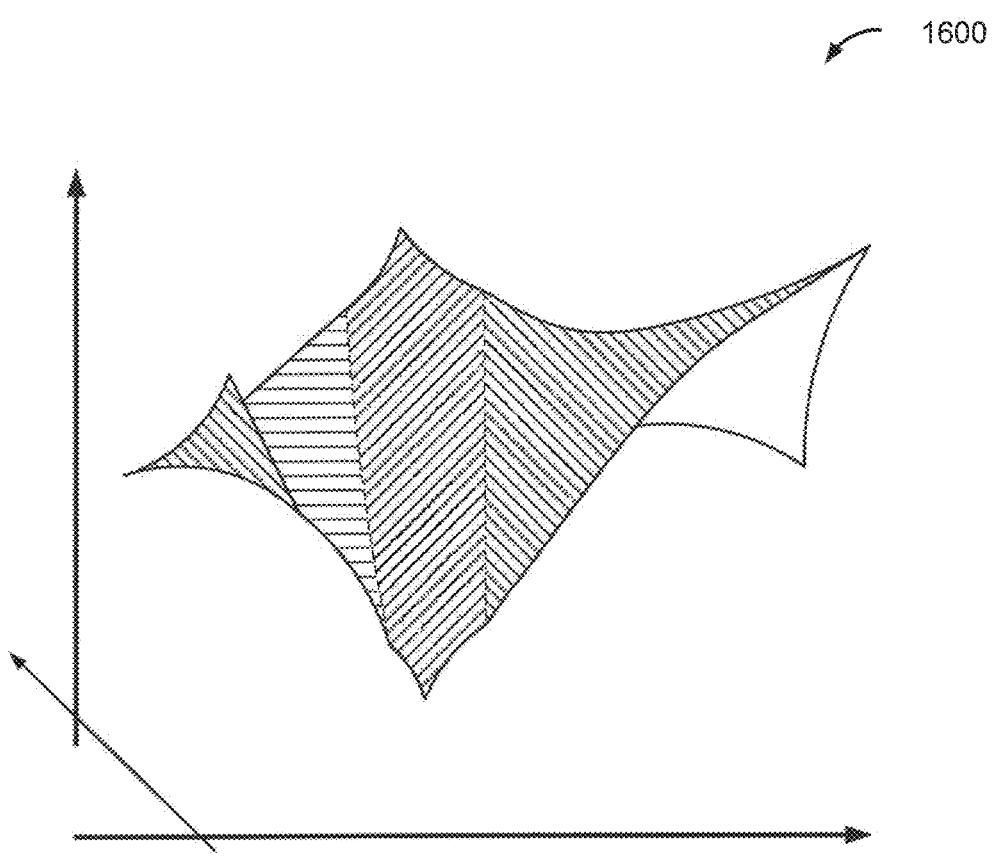
FIG. 16 is a diagram illustrating a 3-D manifold of the output of a second order nonlinear filter embodiment.

FIG. 16 is a diagram illustrating a 3-D manifold of the output of a second order nonlinear filter embodiment. In this example, filter function 1600 is a function of two input variables. The second order terms form parabolic segments of the manifold. Higher order filters such as this can sometimes be used to better approximate the multi-dimensional manifold that defines the desired nonlinear function, such as the actual transfer function of a system, an error function, etc.

The approach can be further extended to develop third or higher order nonlinear filters.

Figure 17:
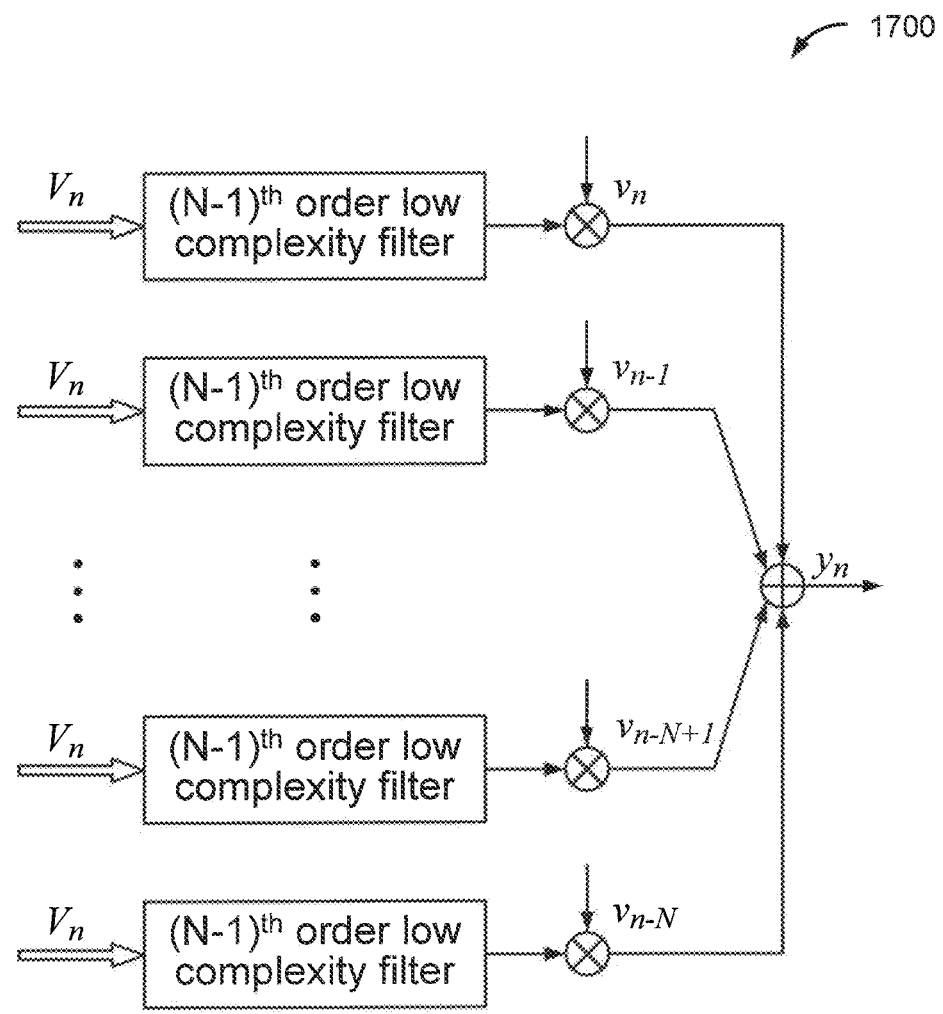
FIG. 17 is a block diagram illustrating an embodiment of an N-th order nonlinear filter.

FIG. 17 is a block diagram illustrating an embodiment of an N-th order nonlinear filter. In the example shown, a flier of order N (N>2) is implemented by nesting lower order filters. N-th order low complexity filter 1700 includes a plurality of (N−1)-th order low complexity filters. The outputs of the (N−1)-th order filters are multiplied with the input variables. Thus, the (N−1)-th order filters act as input coefficients of the N-th order filter. Each of the (N−1)-th order filters in turn may be implemented using a plurality of (N−2)-th order low complexity filters as input coefficients. Nesting allows higher order filters to be more easily implemented.

In some embodiments, the nonlinear filter is implemented as a zero order nonlinear filter, where the transfer function of the filter in each discrete region is a constant. The zero order filter is sometimes referred to as a "catastrophic" structure because of the discontinuities in the filter response. A general form of a zero order nonlinear filter is expressed as:

$$y_n = a_0 + a_1 + \ldots + a_{2N-2} + b + \sum_{j=1}^{K} c_j^0 \lambda_j^0 + \sum_{j=1}^{K} c_j^1 \lambda_j^1 + \ldots + \sum_{j=1}^{K} c_j^{2N-2} \lambda_j^{2N-2}.$$ (Equation 17)

In some embodiments, the zero order nonlinear filter based on equation 17 is implemented similarly as filter 1300 of FIG. 13, except that the multiplications by $v_n$, $v_{n-1}$, etc. are omitted and the outputs $$a_0 + \sum_{j=1}^{K} c_j^0 \lambda_{jn}^0, \ a_N + \sum_{j=1}^{K} c_j^1 \lambda_{jn}^1,$$

etc. are summed directly.

Nonlinear filters of different orders can be combined to form a new filter with the desired transfer function.

Figure 18:
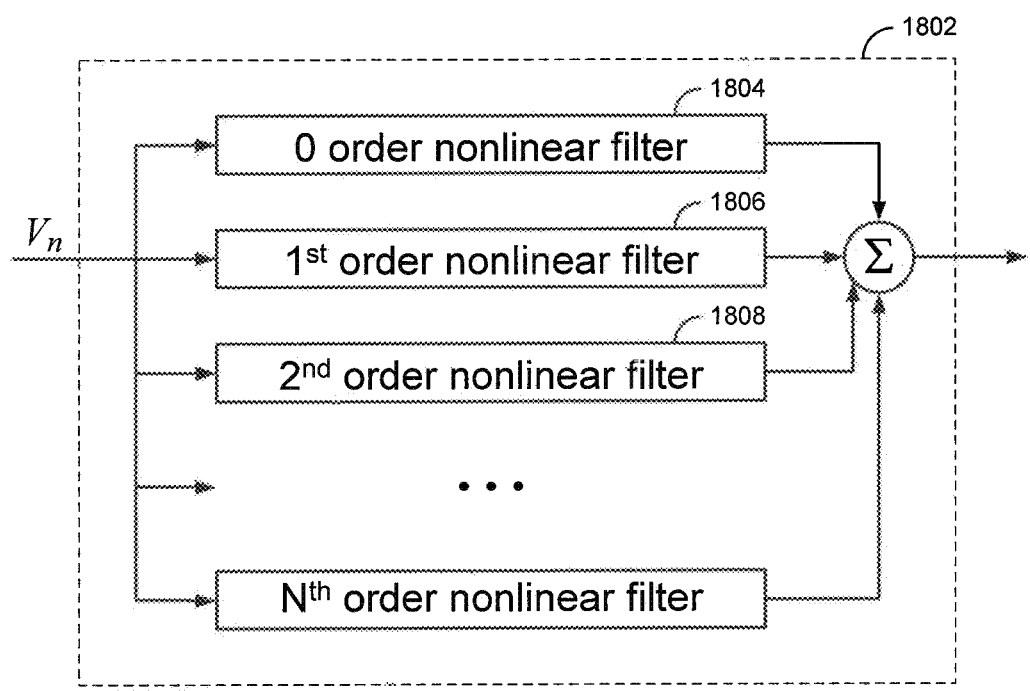
FIG. 18 is a block diagram illustrating a nonlinear filter embodiment.

FIG. 18 is a block diagram illustrating a nonlinear filter embodiment. In the example shown, nonlinear filter 1802 is implemented using a zero order nonlinear filter 1804, a first order nonlinear filter 1806, a second order nonlinear filter 1808, and other higher order nonlinear filters up to order N. More than one filter of a certain order may be used. One or more orders may be omitted. The selection of N depends on the requirements of filter 1802 and may vary for different embodiments. A single zero order nonlinear filter may be sufficient for some applications while an N greater than 3 may be required for some others. A nonlinear filter constructed by combining different orders of nonlinear filters can achieve the desired filter requirements with improved computational efficiency.

The complexity of nonlinear filters can be further reduced in some embodiments. Take the following first order filter for example:

$$y_n = a_0 v_n + a_1 v_{n-1} + b + \sum_{j=1}^{K} c_j^0 |v_n + \beta_j^0| + \sum_{j=1}^{K} c_j^1 |v_{n-1} + \beta_j^1|$$ (Equation 18)

$$= \left(a_0 + \sum_{j=1}^{K} c_j^0 \lambda_j^0\right) v_n + \left(a_1 + \sum_{j=1}^{K} c_j^1 \lambda_j^1\right) v_{n-1} +$$

$$\left(b + \sum_{j=1}^{K} c_j^0 \lambda_j^0 \beta_j^0 + \sum_{j=1}^{K} c_j^1 \lambda_j^1 \beta_j^1\right)$$

$$= \tilde{a}_{0,n} v_n + \tilde{a}_{1,n} v_{n-1} + \tilde{b}_n$$

where $$\lambda_j^m = \text{sign}(v_n + \beta_j^m).$$ (Equation 19)

Since $\lambda_j^1 = \pm 1$, the coefficient $$\sum_{j=1}^{K} c_j^m \lambda_j^m$$

can be computed without any multiplication. Similarly, $$\sum_{j=1}^{K} c_j^m \lambda_j^m \beta_j^m$$

can also be computed without multiplications since the product $c_j^m \beta_j^m$ can be pre-computed, stored and looked up when needed. Thus, the nonlinear filter of equation 18 can be implemented as a first order filter that requires only two multiplication operations.

Figure 19:
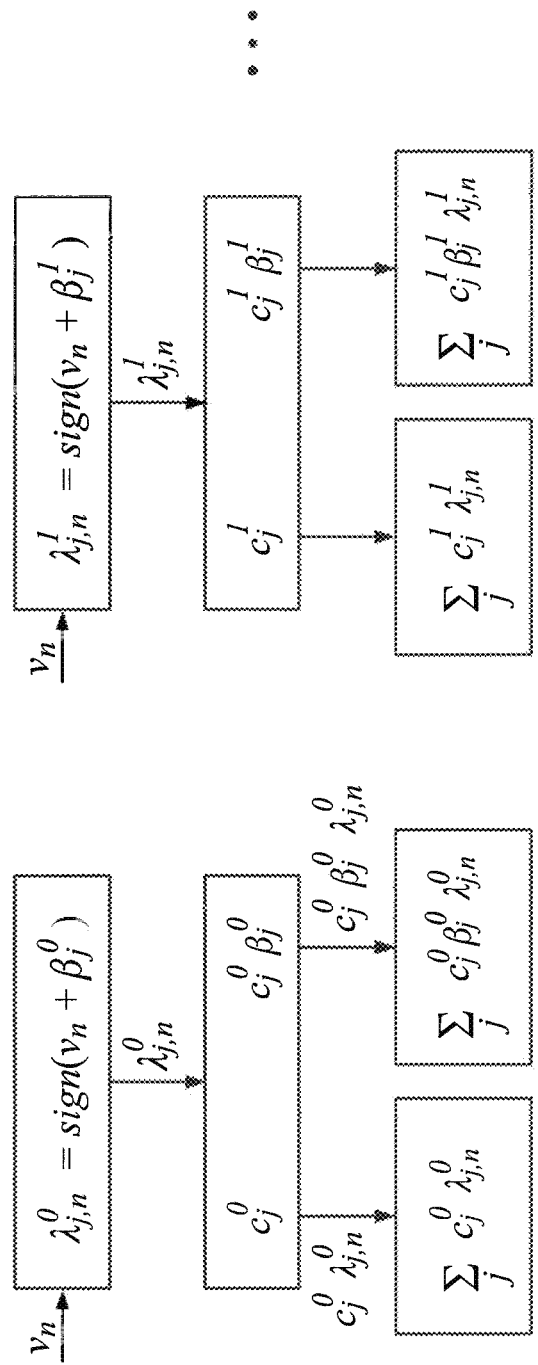
FIG. 19 is a diagram illustrating a computational block embodiment used to compute the nonlinear filter coefficients.

FIG. 19 is a diagram illustrating a computational block embodiment used to compute the nonlinear filter coefficients. In this example, the coefficients for the filter shown in equation 21 are computed. Different ranges of inputs result in different $\lambda_j^m$, which can be either 1 or −1 Potential coefficient values $$\sum_{j=1}^{K} c_j^m \lambda_j^m \text{ and } \sum_{j=1}^{K} c_j^m \lambda_j^m \beta_j^m$$

that correspond to different input ranges are pre-computed and stored in registers. When an input is received, it is compared with the set of $\beta_j^m$ to determine its relative location in the range of inputs and the corresponding pre-computed coefficient value for this particular location.

In some embodiments, the reduction of error in the feedback signal uses a nonlinear implementation that is embodied in a low-complexity nonlinear filter form that has a low number of multiply operations while maintaining a powerful ability to emulate very complex nonlinear distortion functions. The coefficients are set by trying to reduce the error between a desired set of samples (e.g., reference signal) as filtered using the distortion function or model and the actual samples (e.g., the feedback signal which includes linear and nonlinear distortion introduced by components and processing). The reduction of error is achieved by fitting the coefficients of the non-linear model (e.g., using a gradient descent method) to minimize the error. Low complexity means low cost, low power dissipation, and low noise.

CONCLUSION

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments, but should be defined only in accordance with the following claims and their equivalents.

What is claimed is:

1. A signal-processing system, comprising:
    a plurality of signal processing units associated with corresponding input data signals;
    a storage unit configured to store context states associated with input data signals and corresponding feedback signals;
    a feedback channel configured to convey feedback signals from outputs associated with the plurality of signal processing units; and
    a correlator, coupled to the feedback channel, configured to generate respective correcting information to be used by respective signal processing units, wherein a respective correcting information is based upon a respective context state and a corresponding feedback signal associated with the input data signal.

2. The system of claim 1, wherein the signal processing units comprise nonlinear signal processing units.

3. The system of claim 1, wherein the correlator comprises:
    a receiving unit configured to receive a reference signal associated with the input data signal and the corresponding feedback signal,
    an error calculating unit configured to calculate an error between the reference signal and the corresponding feedback signal, and
    a correction calculation unit configured to calculate the respective correcting information based on the error and the context state.

4. The system of claim 1, wherein the respective correcting information is provided to a correcting unit of a signal processing unit associated with the input data signal.

5. The system of claim 4, further comprising:
a multiplexer configured to provide the respective correcting information to the respective correcting units of the signal processing units.

6. The system of claim 1, further comprising:
a storage unit configured to store the context state associated with the input data signal.

7. The system of claim 1, wherein the context state comprises a prior correcting information.

8. The system of claim 1, wherein the context state comprises a prior feedback signal state.

9. The system of claim 1, wherein the context state comprises a prior calculation state.

10. The system of claim 1, wherein the respective correcting information associated with each corresponding feedback signal is generated according to a time division schedule.

11. The system of claim 1, wherein the plurality of signal processing units, the storage unit, the feedback channel, and the correlator are configured and arranged to form an integrated device.

12. A method for processing a plurality of signals, comprising:
associating a plurality of input data signals with a corresponding plurality of signal processing units, wherein each input data signal of the plurality of input data signals has a corresponding feedback signal; and
for each feedback signal:
retrieving a respective context state associated with the corresponding feedback signal,
receiving the corresponding feedback signal, and
generating a respective correcting information to be used by respective signal processing units based upon the respective context state and the corresponding feedback signal associated with the input data signal.

13. The method of claim 12, wherein the plurality of signal processing units comprise nonlinear signal processing units.

14. The method of claim 12, further comprising:
receiving a reference signal associated with the input data signal and the corresponding feedback signal;
calculating an error between the reference signal and the corresponding feedback signal; and
calculating the respective correcting information based on the error and the context state.

15. The method of claim 12, wherein the respective correcting information is provided to a correcting unit of a signal processing unit associated with the input data signal.

16. The method of claim 12, further comprising:
storing the context state associated with the input data signal.

17. The method of claim 12, wherein the context state comprises a prior correcting information.

18. The method of claim 12, wherein the context state comprises a prior feedback signal state.

19. The method of claim 12, wherein the context state comprises a prior calculation state.

20. The method of claim 12, wherein generating the respective correcting information for each corresponding feedback signal is performed according to a time division schedule.

* * * * *